(12) United States Patent
Caba

(10) Patent No.: US 11,549,967 B1
(45) Date of Patent: Jan. 10, 2023

(54) REMOTE DETECTION OF ELECTRICAL FAULT VIA ELECTRICALLY CONDUCTIVE FLUID PROBE

(71) Applicant: Joseph Caba, Covington, LA (US)

(72) Inventor: Joseph Caba, Covington, LA (US)

(*) Notice: Subject to any disclaimer, the term of this patent is extended or adjusted under 35 U.S.C. 154(b) by 107 days.

(21) Appl. No.: 16/952,545

(22) Filed: Nov. 19, 2020

Related U.S. Application Data

(60) Provisional application No. 62/939,962, filed on Nov. 25, 2019.

(51) Int. Cl.

| | |
|---|---|
| *G01R 1/04* | (2006.01) |
| *G01R 1/067* | (2006.01) |
| *G01R 1/073* | (2006.01) |
| *G01R 31/26* | (2020.01) |
| *G01R 31/27* | (2006.01) |
| *G01R 31/52* | (2020.01) |
| *B63B 79/30* | (2020.01) |
| *G01R 31/00* | (2006.01) |

(52) U.S. Cl.
CPC .......... *G01R 1/06783* (2013.01); *B63B 79/30* (2020.01); *G01R 31/008* (2013.01); *G01R 31/52* (2020.01)

(58) Field of Classification Search
CPC .......... G01R 1/04; G01R 1/067; G01R 1/073; G01R 31/26; G01R 31/27; G01R 31/52; G01R 31/00; G01R 31/008
See application file for complete search history.

(56) References Cited

U.S. PATENT DOCUMENTS

2016/0245867 A1* 8/2016 Diesen .................. B63C 11/52

* cited by examiner

*Primary Examiner* — Neel D Shah
(74) *Attorney, Agent, or Firm* — Roy Kiesel Ford Doody & North, APLC; Brett A. North

(57) ABSTRACT

Disclosed is a detector 10 using a liquid spray 2000 for detecting electrical faults or shorts with the detector including a body 100 having an interior 120; a hose or pipe 130 fluidly connected to interior 120; a trigger valve 140 operatively connected to hose 130; a conductor 200 attached to detector 10; and/or a pump 110 fluidly connected to interior 120. In various embodiments the detector 10 can cause liquid spray 2000 to be sprayed on a subregion of an item such as a remotely operated vehicle to create a closed electrical circuit through the liquid spray and the conductor in the detector.

20 Claims, 21 Drawing Sheets

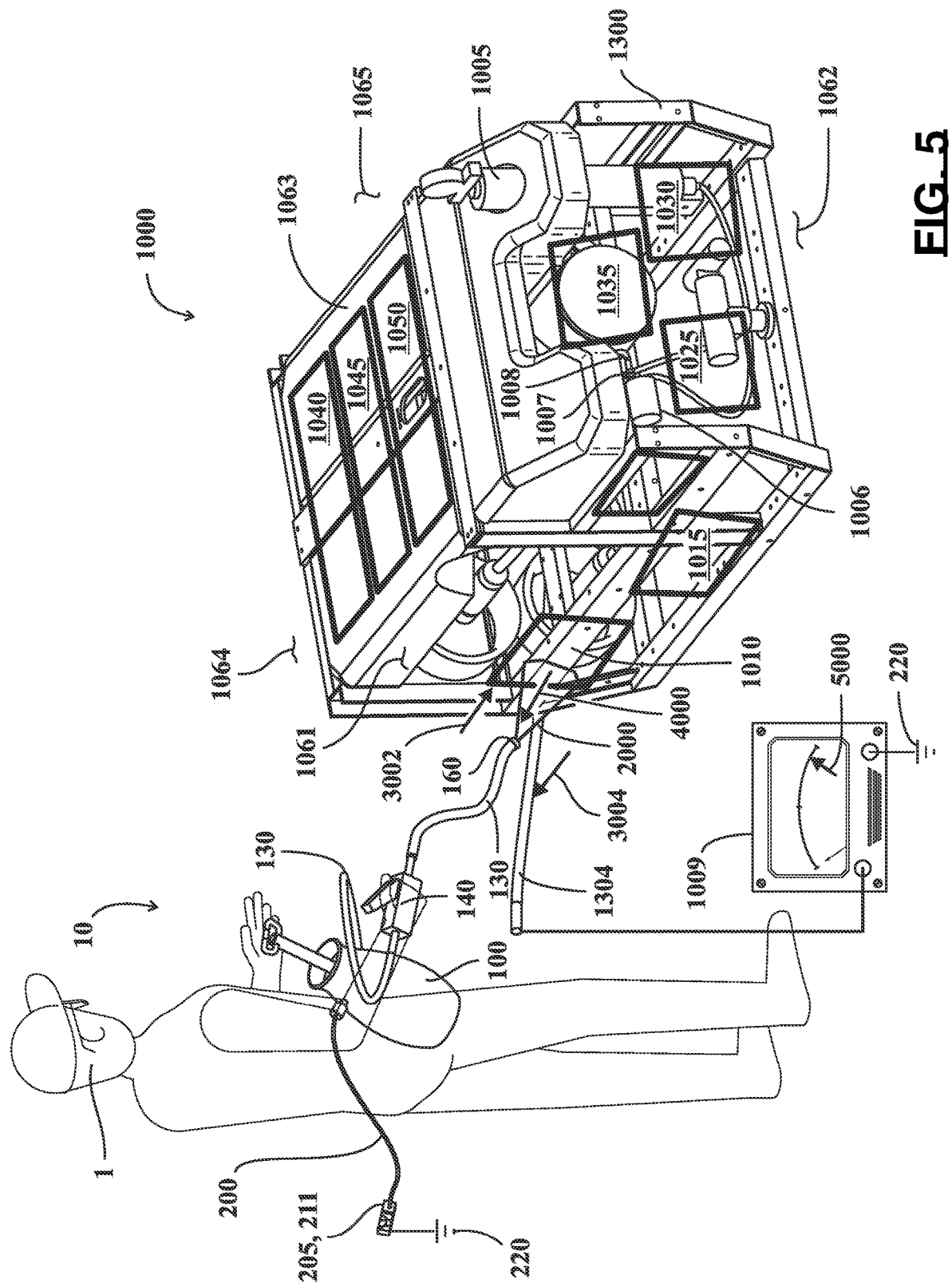
FIG._5

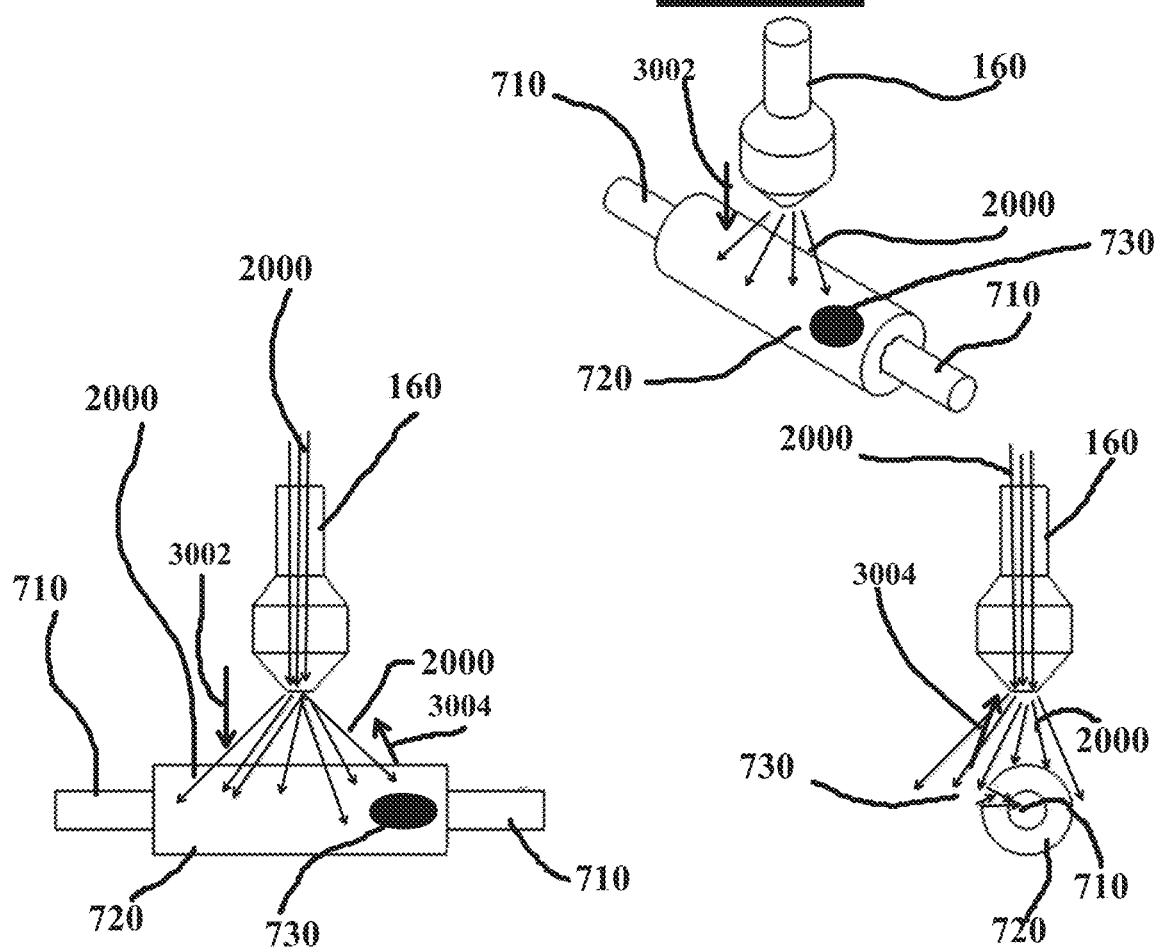

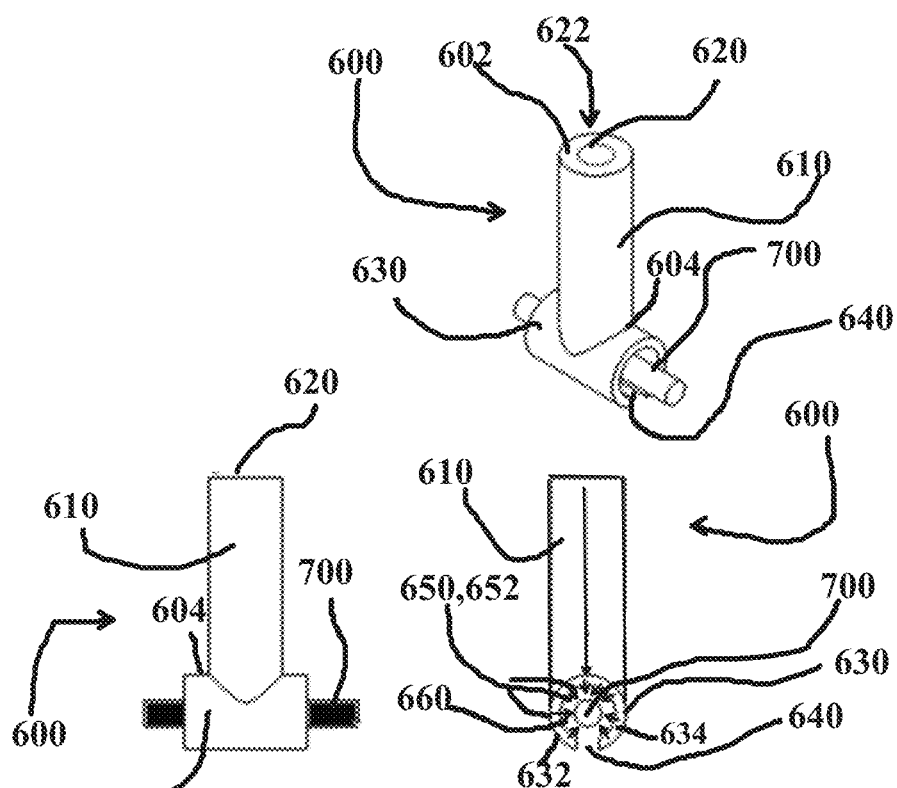

REMOTE DETECTION OF ELECTRICAL FAULT VIA ELECTRICALLY CONDUCTIVE FLUID PROBE

CROSS-REFERENCE TO RELATED APPLICATIONS

This application claims the benefit of U.S. provisional patent application Ser. No. 62/939,962, filed on Nov. 25, 2019, priority to/of which is hereby claimed and such application is hereby incorporated herein by reference in its entirety.

STATEMENT REGARDING FEDERALLY SPONSORED RESEARCH OR DEVELOPMENT

Not applicable

REFERENCE TO A "MICROFICHE APPENDIX"

Not applicable

BACKGROUND

This invention is directed to an electrical test probe and method for its use, particularly for use in detecting an electrical shorts or faults within the electrical circuitry of a remotely operated underwater vehicles.

It is well know by those skilled in the art that a method used to detect the presence of an electrical short or fault within the electrical circuitry of a Remotely Operated underwater Vehicle ("ROV") includes submerging into water a ROV and checking for electrical shorts or faults located somewhere in the in ROV.

However, this prior art method of short or fault detection does not allow for localized detection within the electrical circuitry of a ROV.

Consequently, there is a need for a method and apparatus for localized detection of an electrical short or fault within the electrical circuitry of a ROV.

While certain novel features of this invention shown and described below are pointed out in the annexed claims, the invention is not intended to be limited to the details specified, since a person of ordinary skill in the relevant art will understand that various omissions, modifications, substitutions and changes in the forms and details of the device illustrated and in its operation may be made without departing in any way from the spirit of the present invention. No feature of the invention is critical or essential unless it is expressly stated as being "critical" or "essential."

SUMMARY

In one embodiment is provided a method of detecting an electrical short or fault, comprising the following steps of:
 (a) providing an item to be checked for an electrical short or fault;
 (b) providing an electrical short or fault detector, the detector comprising a body having an interior and an outlet fluidly connected to the interior, and a volume of electrically conductive fluid contained in the interior;
 (c) causing a stream of electrically conductive liquid to run in a first direction from the outlet to a localized area of the item; and
 (d) during step "c" a current running through the stream of electrically conductive liquid and the current causing a fault or short signal to occur.

In various embodiments the method includes the following additional steps:
 (e) forming a closed circuit between the item to be checked and the stream of electrically conductive liquid of step "c".

Various embodiments provide a method of detecting a leak, comprising the steps of:
 (a) providing an item to be checked for an electrical short or fault;
 (b) providing an electrical short or fault detector, the detector comprising a body having an outlet;
 (c) causing a stream of electrically conductive liquid to run in a first direction from the outlet to a localized area of the item; and
 (d) during step "c" the stream causing a current to run through the stream of electrically conductive liquid and further causing a fault or short signal to occur.

Various embodiments provide a method of detecting an electrical short or fault in a subregion a ROV/item believed to have an electrical short or fault, comprising the steps of:
 (a) accessing an item to be checked for an electrical short or fault, the item having an exterior surface with a total exterior surface area, and plurality of sub-regions each having an exterior subregion surface area which is substantially smaller than the total exterior surface area;
 (b) providing an electrical short or fault detector, the detector having a body with an interior and an outlet fluidly connected to the interior, a volume of electrically conductive fluid contained in the interior, and a conductor having first and second ends and electrically connecting the first end to the item;
 (c) causing a stream of electrically conductive liquid to be sprayed on the item from the outlet to a localized area of the item; and
 (d) during step "c" the stream creating a closed circuit between the stream, the item, and the conductor.

In various embodiments the detector can include the following components:
 (a) a body having an outlet;
 (b) a hose or pipe fluidly connected to outlet;
 (c) a trigger valve operatively connect to hose; and/or
 (d) conductor attached to detector.

In various embodiments the detector can include the following components:
 (a) a body having an interior;
 (b) a hose or pipe fluidly connected to interior;
 (c) a trigger valve operatively connect to hose;
 (d) conductor attached to detector;
 and/or
 (e) a pump fluidly connected to interior.

BRIEF DESCRIPTION OF THE DRAWINGS

FIG. 5 is a perspective view of one embodiment of the method using the detector of FIG. 1.

FIGS. 5a through 5d schematically illustrate the method where the stream is directed at a subregion that does not show a short or fault in apparatus, wherein FIG. 5a is a perspective view of this step, FIG. 5b is a side view, FIG. 5c is a front view, and FIG. 5d is a top view.

FIGS. 5e through 5h schematically illustrate the method where the stream is directed at a subregion that does show a short or fault in apparatus, wherein FIG. 5e is a perspective view of this step, FIG. 5f is a side view, FIG. 5g is a front view, and FIG. 5h is a top view.

FIG. 8 is a perspective view schematically showing the testing of an insulated wire or cable area with detector.

FIG. 9 is a side view of the testing step shown in FIG. 8.

FIG. 10 is a front view of the testing step shown in FIG. 8.

FIG. 11 is a perspective view of an alternative nozzle which can be used with various embodiments.

FIG. 12 is a front view of the alternative nozzle of FIG. 11.

FIG. 13 is a side view of the alternative nozzle of FIG. 11.

DETAILED DESCRIPTION

Figure 1:
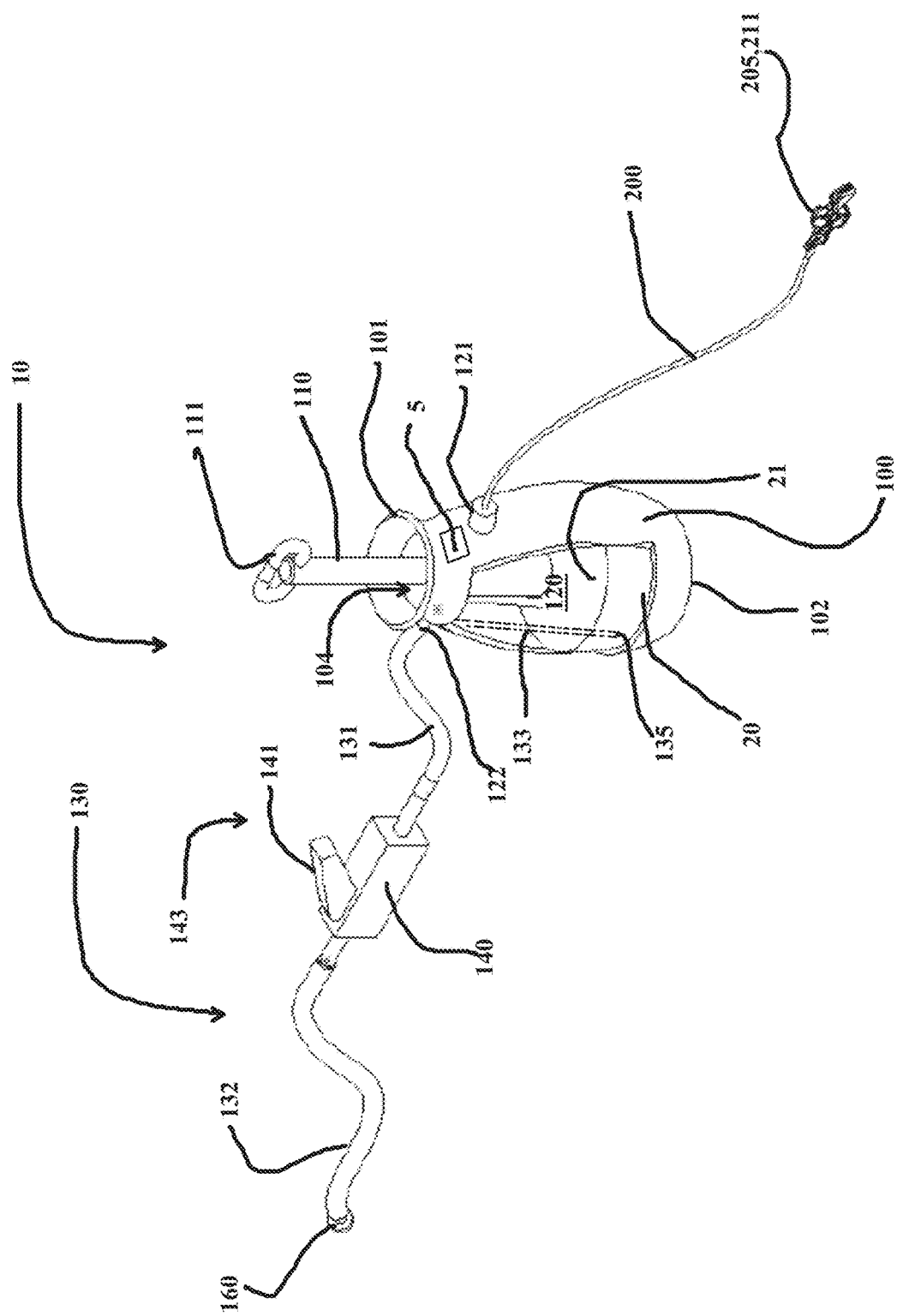
FIG. 1 is a sectional perspective view of one embodiment of a detector which can be used in the method, illustrating at least one conduit for electrically connecting a ground to a volume of electrically conductive fluid contained within a pump assembly.
Figure 2:
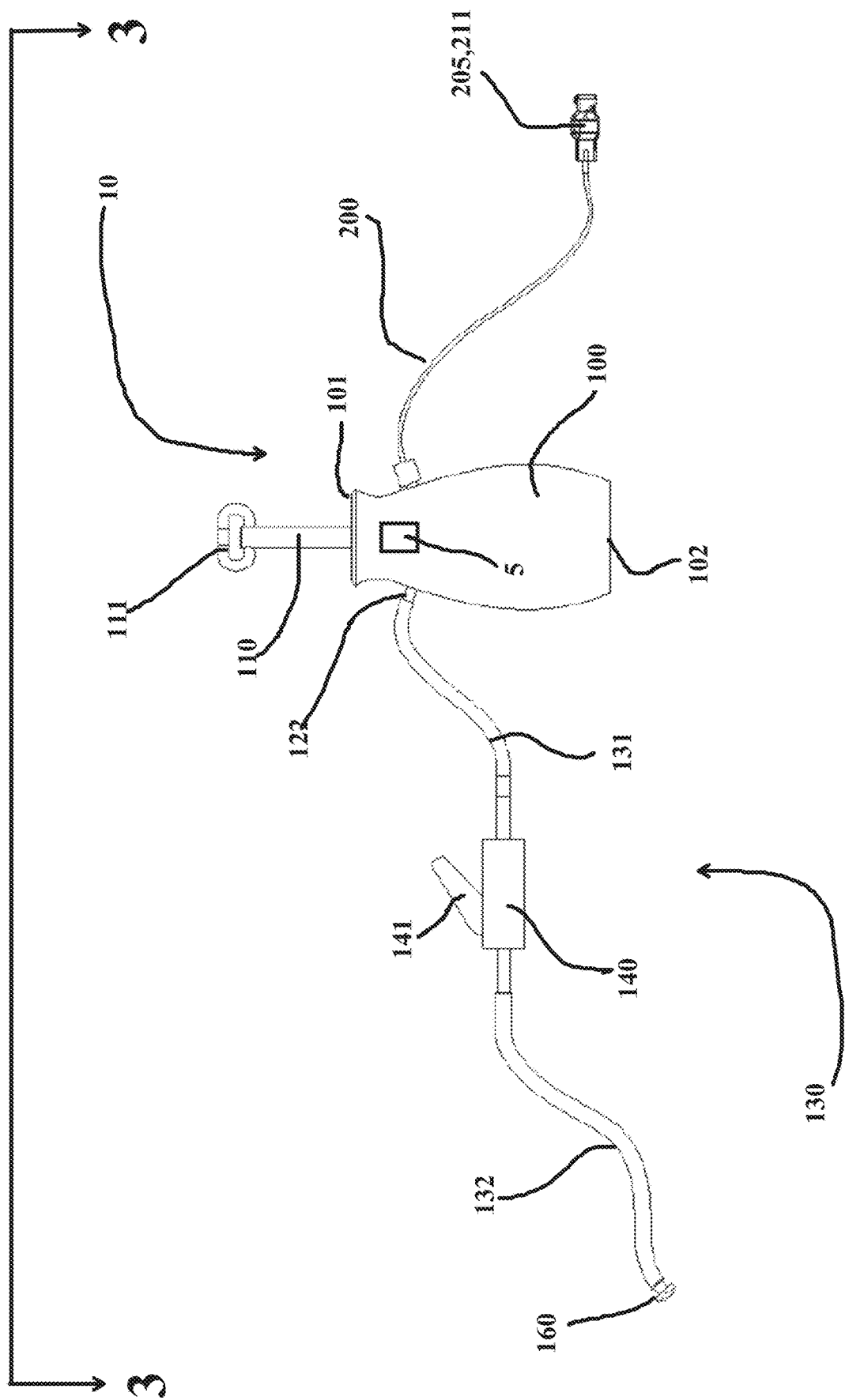
FIG. 2 a side view of the embodiment of the detector of FIG. 1.
Figure 3:
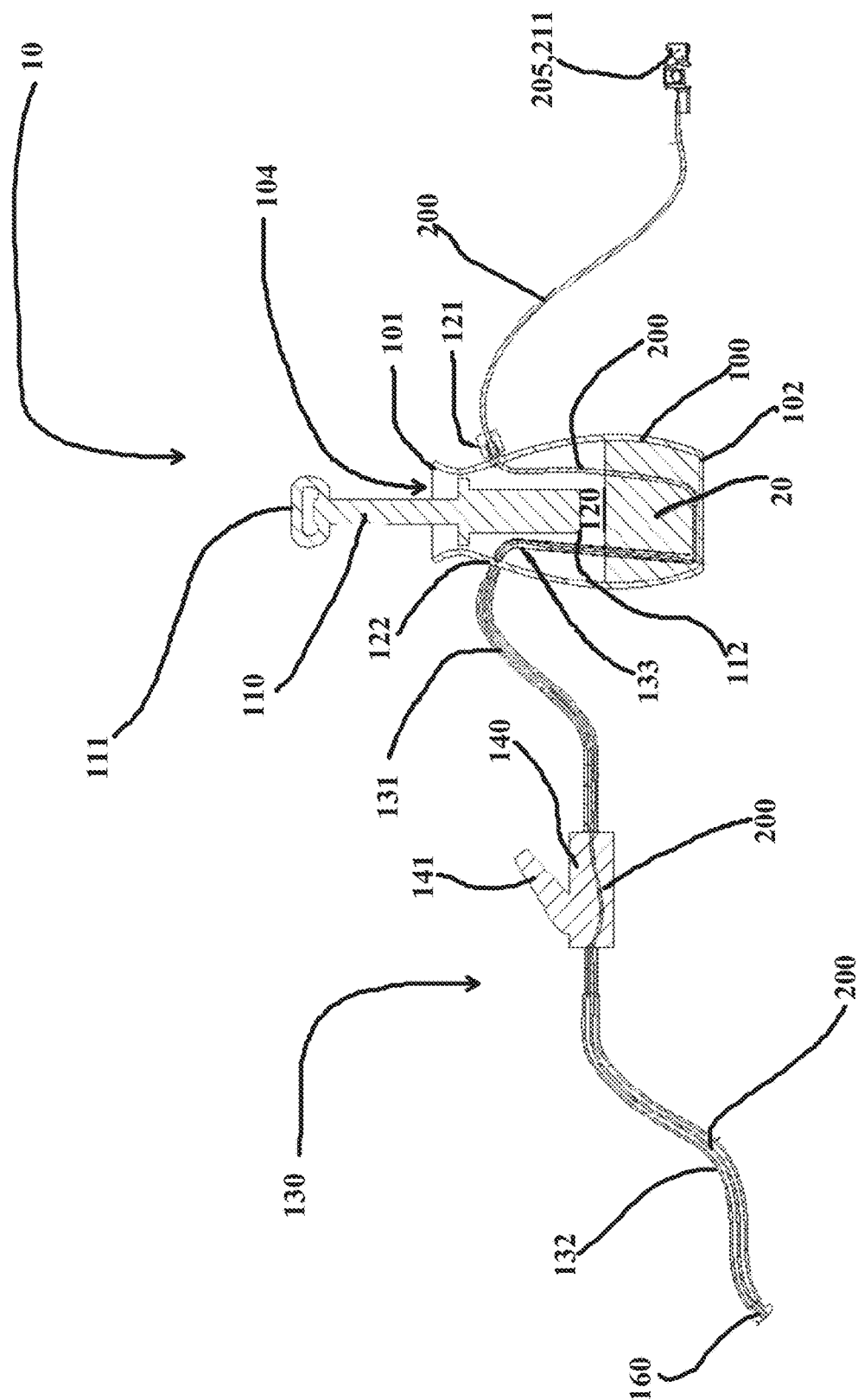
FIG. 3 is a sectional view of one embodiment of the detector of FIG. 2, taken along lines 3-3.
Figure 4:
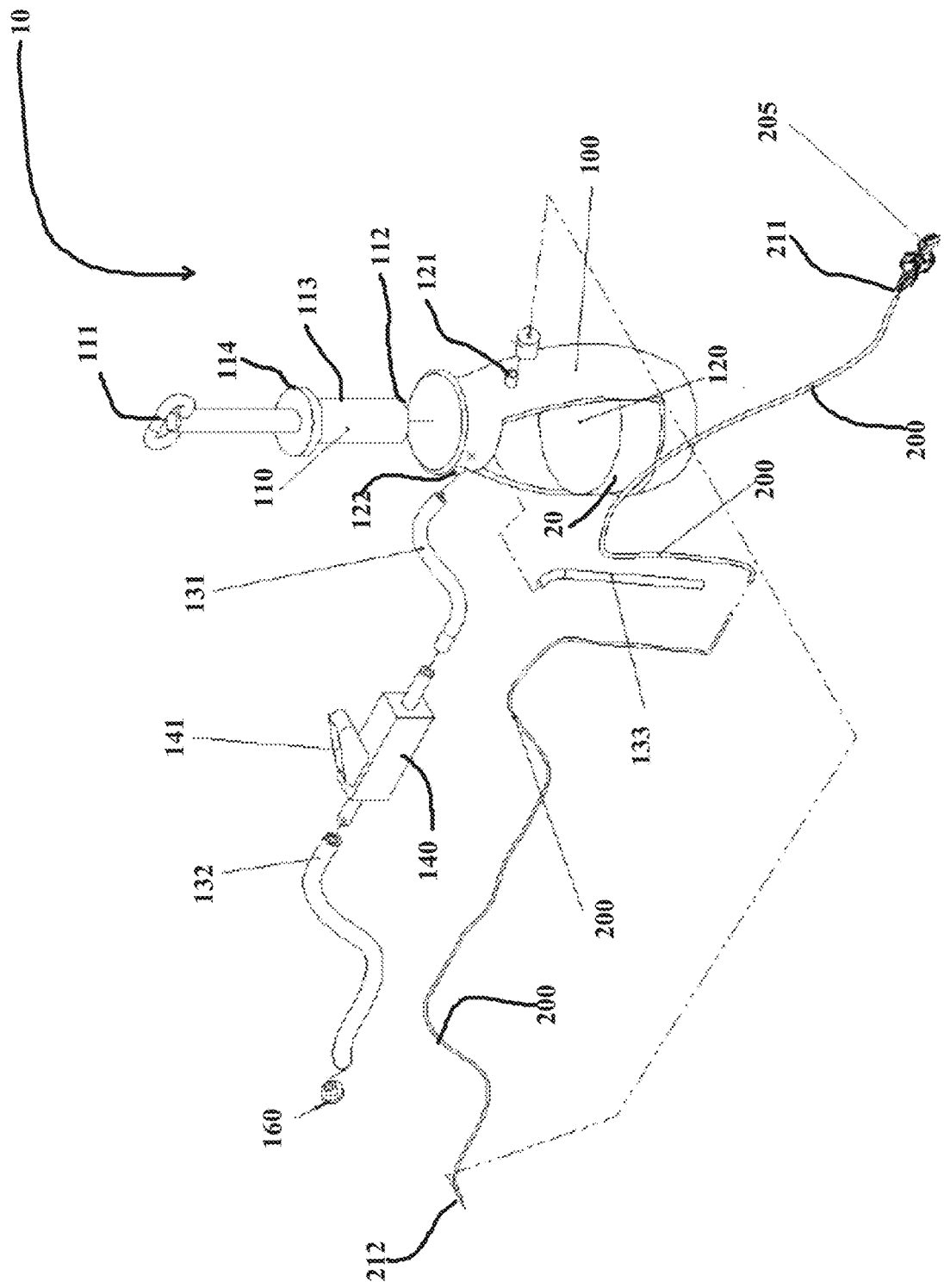
FIG. 4 is an exploded view of the detector of FIG. 1.

Detailed descriptions of one or more preferred embodiments are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in any appropriate system, structure or manner.

Apparatus

FIGS. 1 through 4 are views of one embodiment of detector 10 which can be used in the method. Detector 10 can include the following components:

(a) a body 100 having an interior 120;

(b) a hose or pipe 130 fluidly connected to interior 120;

(c) a trigger valve 140 operatively connect to hose or pipe 130;

(d) conductor 200 attached to detector 10;

and/or (e) a pump 110 fluidly connected to interior 120.

Each of the above referenced components will be described below.

In various embodiments, body 100 can include first 101 and second 102 ends. Between first 101 and second 102 ends can be interior 120. Opening 104 can be located adjacent first end 101. Source of electrically conductive fluid 20 with top level 21 can be stored in interior 120. Third pipe section 133 can be located in interior 120 and be fluidly connected to outlet 122. Opening 135 of pipe section 133 can be located adjacent second end 102 which is below top level 21 of fluid 20.

In various embodiments, hose or pipe 130 can be fluidly connected to interior 120 of body 100. Hose or pipe 130 can include first 131 and second 132 sections. Trigger valve 140 can be connected to both first 131 and second 132 sections. Trigger valve 140 can include trigger control 141 which places valve 140 in open and closed states. When trigger valve 140 is in an open state first section 131 is fluidly connected to second section 132. When trigger valve 140 is in the closed state first section 131 is fluidly disconnected to second section 132. Nozzle 160 can be connected to hose or pipe 130 via second section 132.

In various embodiments, a source of electrically conductive fluid 20 can be included in interior 120. In various embodiments source of electrically conductive fluid 20 can be a static volume of electrically conductive fluid having top 21. In various embodiments the electrical conductivity of the fluid in a static condition, at sea level and 70 degrees F., can be at least 10, 15, 20, 25, 30, 35, 40, 45, 50, 55, 60, 65, 70, 75, 80, 90, 100, 125, 150, 175, 200, 250, 300, 350, 400, 500, 600, 700, 800, 900, and/or 1000 mS/cm (milli siemens/centimeter). In various embodiments the electrical conductivity of the fluid can fall within a range of between any two of the above referenced electrical conductivity values. In various embodiments the electrically conductive fluid can be selected from the group consisting of surface water, saltwater, brine, seawater, and process water. In various embodiments source of electrically conductive fluid 20 can be dynamic volume of electrically conductive fluid.

In various embodiments, interior 120 of body 100 can be pressurized using a pump 110. Pump 110 can fluidly connected to interior 120 via opening 104 with an air tight seal being formed between pump 110 and body 100. In various embodiments, pump 110 can have first 111 and second 112 ends. First end 111 can include a pump handle. Second end 112 can include pump cylinder 113 and pump seal 114. Pump 110 can be used to pressurize interior 120 containing electrically conductive fluid 20.

In various embodiments, fluid 20, which has been pressurized by pump 110, can exit interior 120 via outlet 122.

In various embodiments, hose 130 is fluidly connected to interior 120 via outlet 122 of body 100. In one embodiment, hose 130 can include first 131 and second 132 segments. In one embodiment trigger valve 140 can connect first 131 and second 132 segments of hose 130. Trigger valve 140 can include trigger 141 which can open and close trigger valve 140.

In various embodiments, conductor can be connected to body 100. In various embodiments, conductor 200 can include first 211 and second 212 ends and can be insulated. In various embodiments second end 212 can be located adjacent nozzle 160. In various embodiments, second end 212 can be located in the interior of hose 130 and adjacent nozzle 160. In various embodiments, conductor 200 can be at least partially contained in hose or pipe 130 passing through second section 132, trigger valve 140, first section 131, and third section 133. In various embodiments, first end 211 can include clamp 205 for grounding. In various embodiments, second end 212 of conductor 200 can contained in hose or pipe 130 adjacent nozzle 160 but the remainder of conductor can be located outside of hose or pipe 130 and preferably insulated. In various embodiments, first end 211 can include clamp 205 for grounding.

In various embodiments, pump 110 can be used to pressurize interior 120 of body 100 along with fluid 20 contained in interior 120. Once pressurized, trigger valve 140 can be used to create a stream 2000 of fluid from fluid 20 located in interior 120. Pushing trigger 141 in the direction of arrow 143 allows the pressurized fluid 20 located in interior 120 to enter pipe 133, pass through first section 131, pass through second section 132, and then exit nozzle 160 as stream 2000. In various embodiments, stream 2000 can have a flow rate that is at least ⅛ gallons per minute. In various embodiments the flow rate can be at least 1/10, ⅛, ¼, ⅜, ½, ⅝, ¾, ⅞, 1, 1.25, 1.5, 1.75, 2, 2.25, 2.5, 2.75, 3, 3.25, 3.5, 3.75, 4, 4.25, 4.5, 4.75, 5, 5.5, 6, 6.5, 7, 7.5, 8, 8.5, 9, 9.5, and 10 gallons per minute. In various embodiments the flow rate of stream 2000 can fall within a range of between any two of the above referenced minimum flow rates.

Method

In various embodiments, detector 10 can be used to detect a short or fault 5010 from a device such as an ROV 1000. In various embodiments, item or ROV 1000 includes a plurality of sides/faces 1061, 1062, 1063, 1064, 1065, and 1066 which can be substantially planar. In various embodiments, the ROV 1000 may include several sub-regions 1010, 1015, 1020, 1025, 1030, 1035, 1040, 1045, 1050 which are of interest in locating an electrical short or fault. For example, side/face 1061 can include subregions 1010, 1015, and 1020; side/face 1062 can include sub-regions 1025, 1030, and 1035; and side/face 1063 can include subregions 1040, 1045, and 1050.

FIG. 5 is a schematic diagram illustrating one embodiment of the method of detecting an electrical short or fault in a device.

Figure 5C:
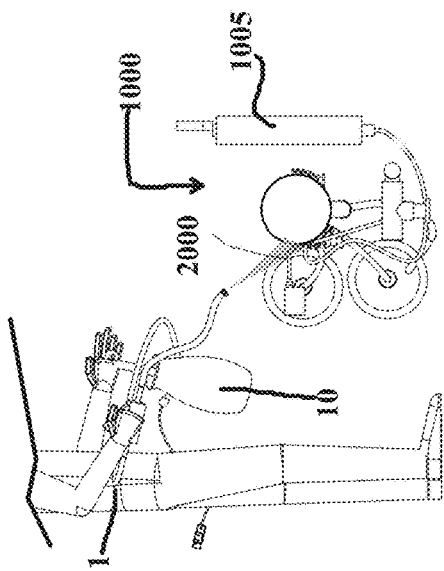
Figure 5A:
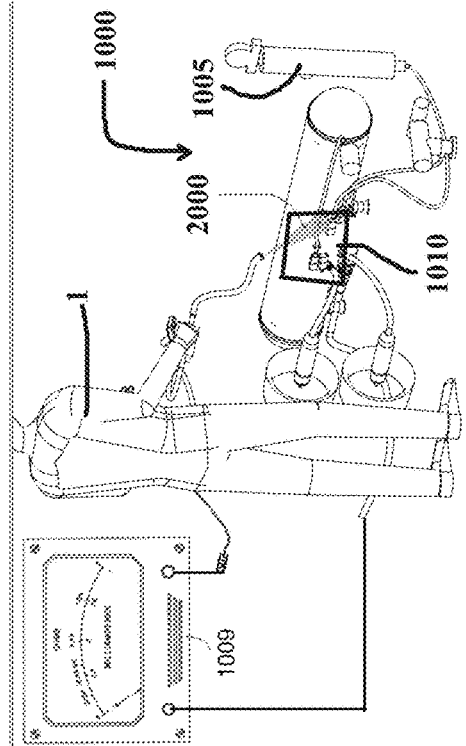
Figure 5B:
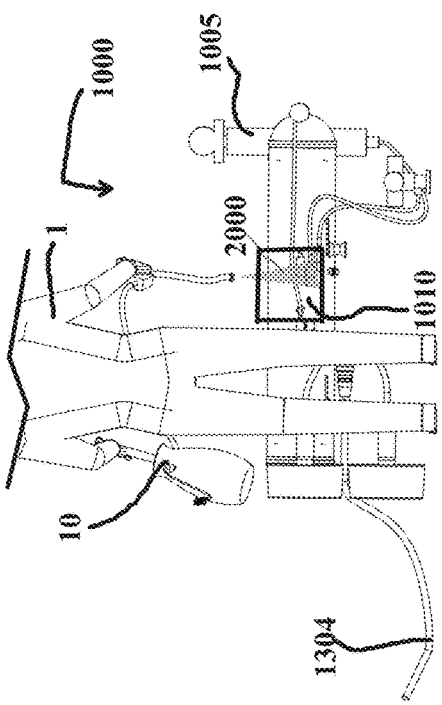
Figure 5D:
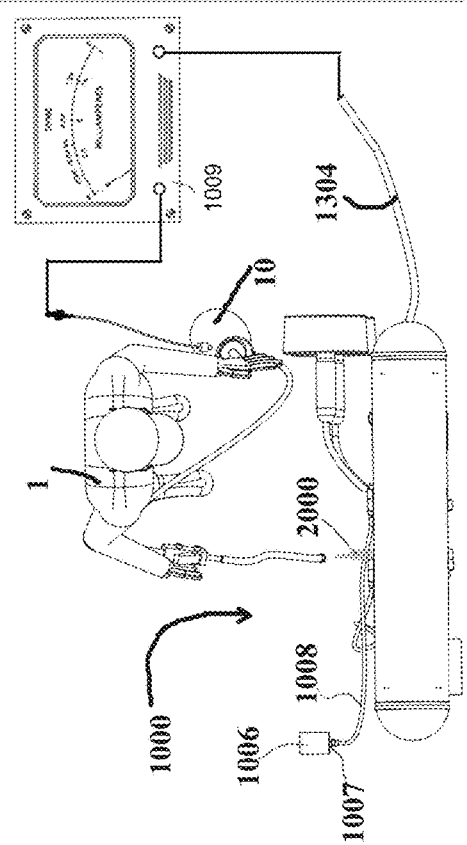

FIGS. 5a through 5d schematically illustrate the method where stream 2000 is directed at subregion 1010 that does not show a short or fault in apparatus 10. FIG. 5a is a perspective view of this step, FIG. 5b is a side view, FIG. 5c is a front view, and FIG. 5d is a top view. In these figures the frame or housing 1300 of item 1000 has been omitted to better see the stream 2000 directed at subregion 1010 but contacting electrical components of item 1000 located behind subregion 1010. Because no short or fault is being sprayed on in subregion 1010, display 1009 does not show current flowing through the apparatus.

Figure 5G:
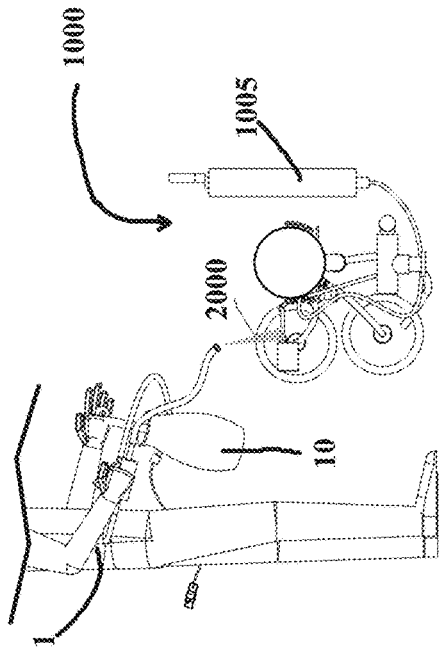
Figure 5E:
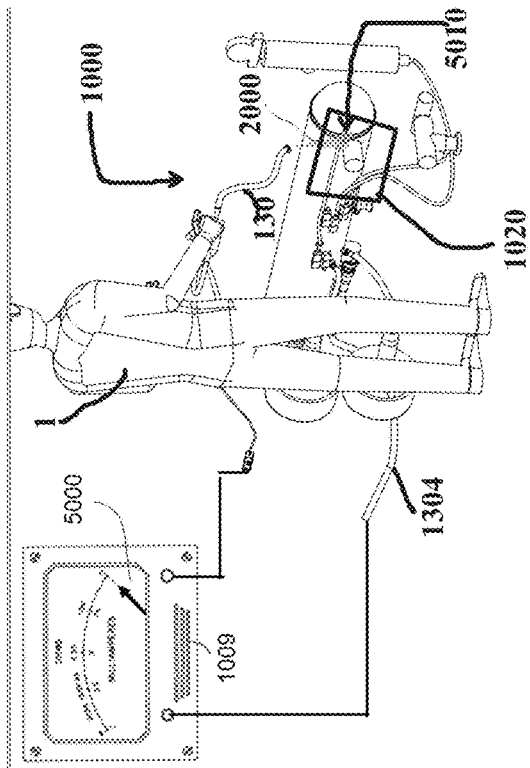
Figure 5F:
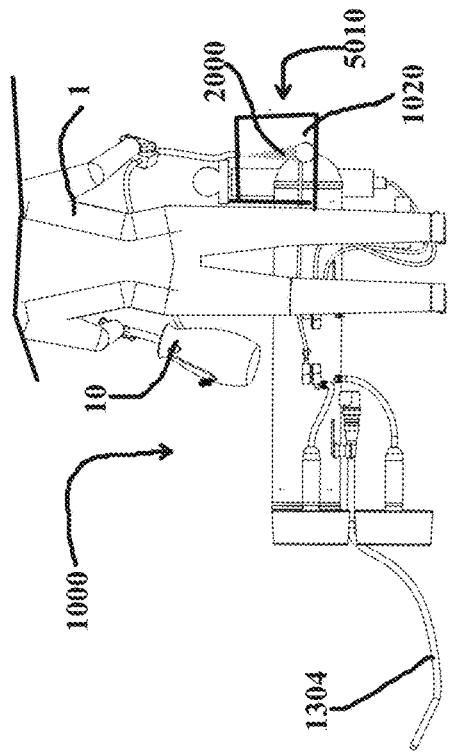
Figure 5H:
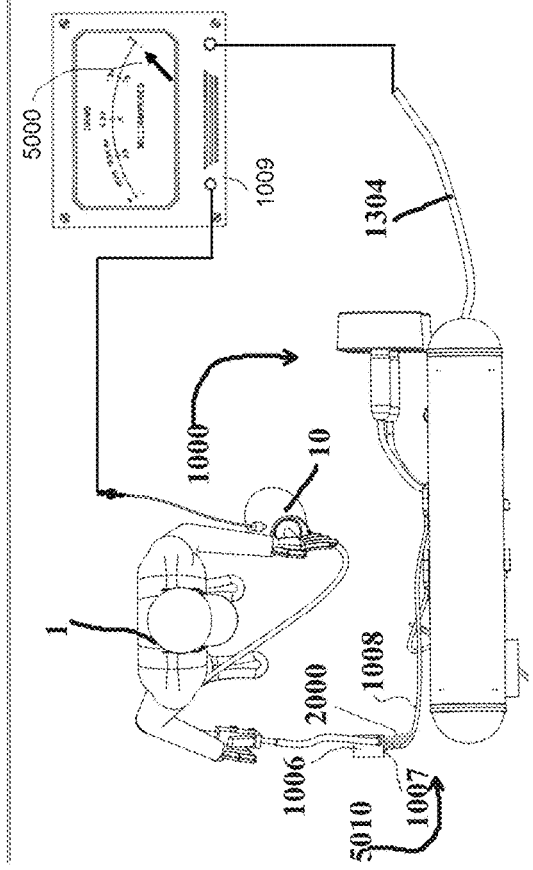

FIGS. 5e through 5h schematically illustrate the method where stream 2000 is directed at subregion 1020 that does show a short or fault in apparatus 10. FIG. 5e is a perspective view of this step, FIG. 5f is a side view, FIG. 5g is a front view, and FIG. 5h is a top view. In these figures the frame or housing 1300 of item 1000 has been omitted to better see the stream 2000 directed at subregion 1020 but contacting electrical components of item 1000 located behind subregion 1020. Because a short or fault is being sprayed on in subregion 1020, display 1009 does show current flowing through the apparatus (and/or a small or zero resistance).

In various embodiments are provided a method which includes the following steps:

(a) providing an item 1000 to be checked for an electrical short or fault;

(b) providing an electrical short or fault detector 10, the detector comprising a body 100 having an interior 120 and an outlet 160 fluidly connected to the interior 120, and a volume of electrically conductive fluid 20 contained in the interior 120;

(c) causing a stream 2000 of electrically conductive liquid to run in a first direction 3002 from the outlet 160 to a localized area 1020 of the item 1000; and (d) during step "c" the stream 2000 causing a current 4000 to run through the stream 2000 of electrically conductive liquid and further causing a fault or short signal 5000 to occur.

In various embodiments the method includes the following additional steps:

(i) during step "c" forming a closed circuit between the item 1000 and the stream 2000 of electrically conductive liquid.

In various embodiments, the detector 10 of step "b" has a valve 140 fluidly connecting the nozzle 160 to the interior 120 of the detector 10, and step "c" includes opening the valve 140 which starts the stream 2000 flowing.

In various embodiments, during step "c" stream 2000 has a flow rate that is at least ⅛ gallons per minute. In various embodiments during step "c" the flow rate of stream 2000 is at least 1/10, ⅛, ¼, ⅜, ½, ⅝, ¾, ⅞, 1, 1.25, 1.5, 1.75, 2, 2.25, 2.5, 2.75, 3, 3.25, 3.5, 3.75, 4, 4.25, 4.5, 4.75, 5, 5.5, 6, 6.5, 7, 7.5, 8, 8.5, 9, 9.5, and/or 10 gallons per minute. In various embodiments during step "c" the flow rate of stream 2000 falls within a range of between any two of the above referenced flow rates.

In various embodiments, during step "d" the shortest distance between nozzle 160 and item 1000 can be no more than 1/10, ⅛, ¼, ⅜, ½, ⅝, ¾, ⅞, 1, 1.25, 1.5, 1.75, 2, 2.25, 2.5, 2.75, 3, 3.25, 3.5, 3.75, 4, 4.25, 4.5, 4.75, 5, 5.5, 6, 6.5, 7, 7.5, 8, 8.5, 9, 9.5, 10, 11, 12, 13, 14, 15, 16, 17, 18, 19, 20, 21, 22, 23, 24, 26, 28, 30, 32, 34, and/or 36 inches. In various embodiments, during step "d" the shortest distance between nozzle 160 and item 1000 falls within a range of between any two of the following distances ⅛, ¼, ⅜, ½, ⅝, ¾, ⅞, 1, 1.25, 1.5, 1.75, 2, 2.25, 2.5, 2.75, 3, 3.25, 3.5, 3.75, 4, 4.25, 4.5, 4.75, 5, 5.5, 6, 6.5, 7, 7.5, 8, 8.5, 9, 9.5, 10, 11, 12, 13, 14, 15, 16, 17, 18, 19, 20, 21, 22, 23, 24, 26, 28, 30, 32, 34, and/or 36 inches. In various embodiments the shortest distance is the length of stream 2000 during step "d."

Figure 7:
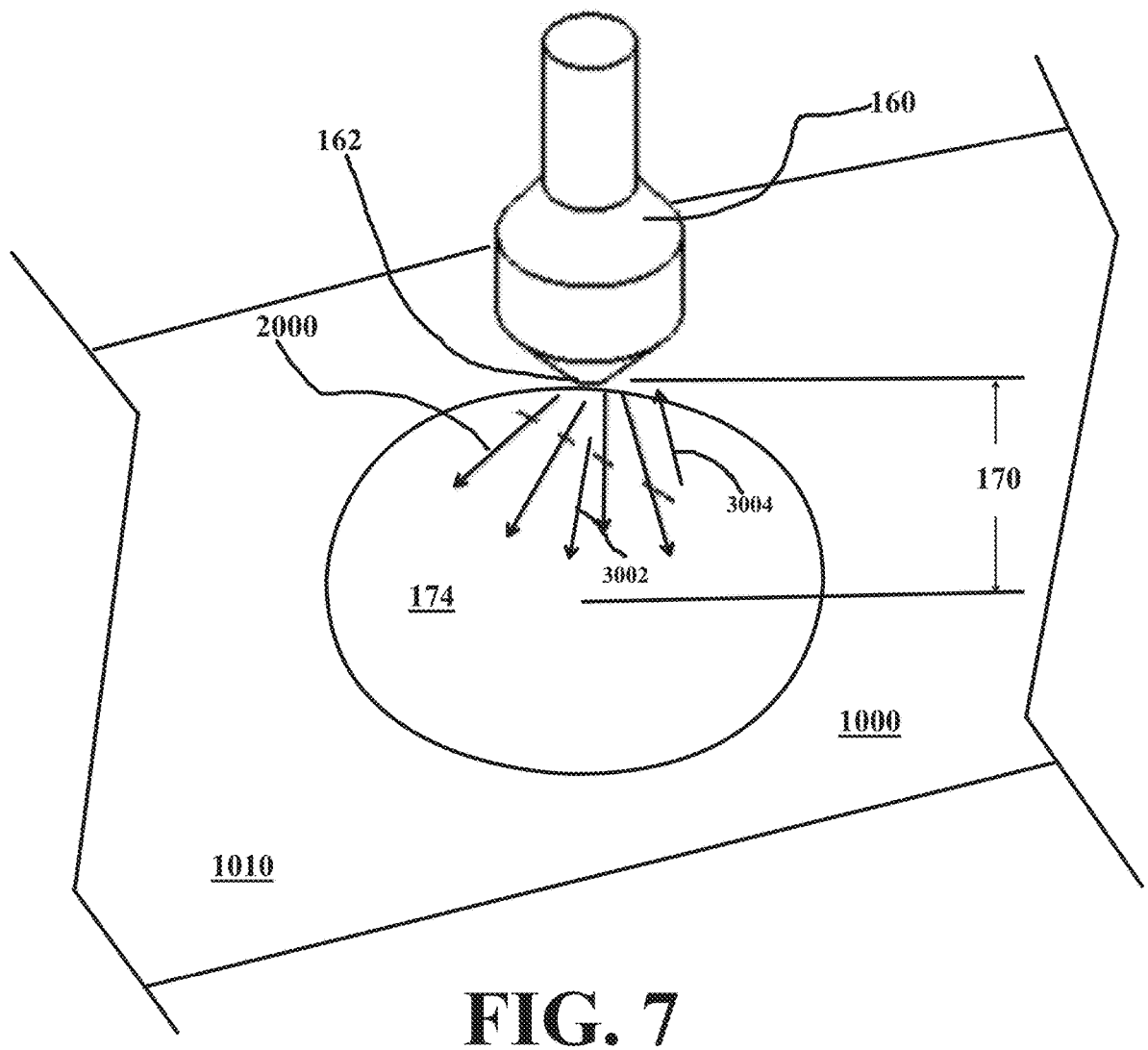
FIG. 7 schematically showing the testing of a particular area with detector.

As schematically illustrated in FIG. 7, in various embodiments during step "d", when testing a particular subregion (e.g., subregion 1010), the tip 162 of nozzle 160 can be maintained at an average of distance 170 from item 1000 and the stream 2000 can have an average maximum stream projected area 174 on contact of item 1000. In various embodiments, during step "d", at the average distance 170 from item 1000, the average maximum stream area 174 of stream 2000 is no more than 1/256, 1/16, ⅛, ¼, ⅜, ½, ⅝, ¾, ⅞, 1, 1.25, 1.5, 1.75, 2, 2.25, 2.5, 2.75, 3, 3.25, 3.5, 3.75, 4, 4.25, 4.5, 4.75, 5, 5.5, 6, 6.5, 7, 7.5, 8, 8.5, 9, 9.5, 10, 11, 12, 13, 14, 15, 16, 17, 18, 20, 25, 30, 35, 40, 45, 50, 55, 60, 70, 75, 80, 90, 100, 110, 120, 130, 144, and/or 144 $in^2$. In various embodiments the average maximum stream area 174 of stream 2000 on contact with item 1000 can fall within a range of between any two of the above referenced maximum areas. Arrow 3002 schematically indicates the direction of the stream 2000. Arrow 3004 schematically indicates current flowing though stream 2000 if detector 10 detects a short or fault (depending on type of current the direction of current flow can be the opposite of arrow 3004, for example in AC current direction will alternate, and in DC current the direction of flow will depend on the power source and polarity of the short or fault).

In various embodiments during step "c" and before step "d", the stream 2000 is directed to a first subregion 1010 of item 1000 and then to a second subregion 1015 of item 1000. In various embodiments during step "c" and before step "d", the stream 2000 is directed to a first subregion 1010 of item 1000, then to a second subregion 1015 of item 1000, and then to a third subregion 1020 of item 1000. In various embodiments during step "c" and before step "d", the stream 2000 is directed to a first subregion 1010 of item 1000, then to a second subregion 1015 of item 1000, then to a third subregion 1020 of item 1000, and then to a fourth subregion 1025 of item 1000.

In various embodiments one or more of the plurality of subregions for a side can be less than a predefined percentage of the projected area of the side on which the subregions are located. In various embodiments the predefined maximum size of the subregion to the side can be less than 1, 2, 3, 4 5, 10, 15, 20, 25, 30, 35, 40, 45, and/or 50 percent of the projected surface area size of the side. In various embodiments the predefined maximum size of the subregion to the size of the side can fall within a range of between any two of the above referenced percentages.

In various embodiments, during step "c", between moving stream 2000 from first subregion 1010 to second subregion 1050, valve 140 is shut off stopping stream 2000 and then reopened restarting stream 2000.

In various embodiments, during step "c", between moving stream 2000 from first subregion 1010 to second subregion 1015, valve 140 is shut off stopping stream 2000 and then reopened restarting stream 2000, and between moving stream 2000 from second subregion 1015 to third subregion 1020, valve 140 is shut off stopping stream 2000 and then reopened restarting stream 2000.

In various embodiments, during step "c", between moving stream 2000 from first subregion 1010 to second subregion 1015, valve 140 is shut off stopping stream 2000 and then reopened restarting stream 2000, between moving stream 2000 from second subregion 1015 to third subregion 1020, valve 140 is shut off stopping stream 2000 and then reopened restarting stream 2000, and between moving stream 2000 from third subregion 1020 to fourth subregion 1025, valve 140 is shut off stopping stream 2000 and then reopened restarting stream 2000.

In various embodiments stream 2000 can remain flowing when being moved between subregions (e.g., between first subregion to second subregion 1015). For example, stream 2000 cam remain flowing when moving stream 2000 from first subregion 1010 to second subregion 1015, when moving stream 2000 from second subregion 1015 to third subregion 1020, when moving from third subregion 1020 to fourth subregion 1025.

In various embodiments, directing stream 2000 to a particular subregion (e.g., 1010) limits stream to that subregion and does not cause stream 2000 to enter another subregion (e.g., 1015 and/or 1020) of this side or face 1062 of item 1000.

In various embodiments, a first plurality of subregions (e.g., 1010, 1015, 1020) can be located on a first face (e.g., face 1061) of item 1000 and a second plurality of subregions (e.g., 1025, 1030, 1035) can be located on a second face (e.g., face 1062) of item 1000.

In various embodiments, a first plurality of subregions (e.g., 1010, 1015, 1020) can be located on a first face (e.g., face 1061) of item 1000; a second plurality of subregions (e.g., 1025, 1030, 1035) can be located on a second face (e.g., face 1062) of item 1000; and a third plurality of subregions (e.g., 1040, 1045) can be located on a third face (e.g., face 1063) of item 1000.

In various embodiments, the method can include the step of receiving a warning signal 5000 that a short or fault is detected in item 1000. In various embodiments the warning signal 5000 can be a visual, audible, and/or haptic warning. In various embodiments the warning signal 5000 can be based on a predefined warning criteria being met for detector 10.

In various embodiments the predefined warning criteria can be a current being measured passing through conductor 200 greater than a predefined minimum current. In various embodiments the predefined minimum current can be 0.0001, 0.001, 0.01, 0.1, 0.25, 0.35, 0.5, 0.65, 0.75, 0.85, 0.95, and/or 1 amperes.

In various embodiments the predefined warning criteria can be a voltage being measured against conductor 200 greater than a predefined minimum voltage. In various embodiments the predefined minimum voltage can be 0.0001, 0.001, 0.01, 0.1, 0.25, 0.35, 0.5, 0.65, 0.75, 0.85, 0.95, 1, 2, 3, 4, 5, 7.5, 10, 12, 15, 20, 24, and/or 30 volts.

In various embodiments the predefined warning criteria can be a voltage drop measured greater than a predefined minimum voltage drop. In various embodiments the predefined minimum voltage drop 1, 2, 3, 4, 5, 10, 15, 20, 25, 30, 35, 40, 45, and/or 50 percent. In various embodiments the voltage drop for the predefined minimum voltage drop can fall within a range of between any two of the above referenced percentages. For example, in various embodiments, detector 10 can include display 1009 to inform user 1 of the presence of an electrical short of fault via stream 2000 forming a closed circuit with electrical short or fault of ROV 1000. In various embodiments, ROV 1000 can include display 1009 indicating either voltage and/or current. Detector 10 locating a short or fault on ROV 1000 via stream 2000 closing a circuit with ROV 1000 can cause display 1009 to change its output (e.g., voltage and/or current reading) and inform user 1 of the presence of an electrical short or fault. For example, the presence of an electrical short can be detected via display 1009 and stream 2000 sprayed upon a subregion of ROV 1000 by display 1009 indicating a decrease in the voltage reading prior to the spraying of spray 2000. For example, if an electrical short or fault exists in a subregion of ROV 1000 spray 2000 in the particular subregion will allow the short or fault to see a closed circuit allowing current to flow through conductor 200 which current can cause the voltage that display 1009 is reading out to decrease thereby indicating to the user 1 that a short or fault exists in the particular subregion that spray 2000 is being sprayed upon at that time.

In various embodiments the fault or short signal/warning 5000 of step "d" can be on a display 1009 of ROV/item 1000. In various embodiments display 1009 can be a indicator of voltage and the fault or short signal/warning 5000 can be a drop in voltage. In various embodiments display 1009 can be a indicator of voltage and the fault or short signal/warning 5000 can be an increase in voltage. In various embodiments display 1009 can be a indicator of electrical current and the fault or short signal/warning 5000 can be an increase in current. In various embodiments display 1009 can be a indicator of electrical current and the fault or short signal/warning 5000 can be a decrease in current.

In various embodiments during step "d" a closed circuit is created between detector 10 and item 1000.

In various embodiments, detector 10 can be used to detect in a localized manner an electrical short or fault in a subregion a ROV/item 1000 believed to have an electrical short or fault 1010 using the following steps:

(a) accessing an item 1000 to be checked for an electrical short or fault, the item 1000 having an exterior surface 1100 with a total exterior surface area 1110, and plurality of sub-regions 1200 each having an exterior subregion surface area which is substantially smaller than the total exterior surface area 1110;

(b) providing an electrical short or fault detector 10, the detector having a body 100 with an interior 120 and an outlet 160 fluidly connected to the interior 120, a volume of electrically conductive fluid 20 contained in the interior 120, and a conductor 200 having first 201 and second 202 ends and electrically connecting the first end 201 to the item 1000;

(c) causing a stream 2000 of electrically conductive liquid to be sprayed on the item 2000 from the outlet 160 to a localized area 1020 of the item 1000; and (d) during step "c" the stream 2000 creating a closed circuit between the stream 2000, the item 1000, and the conductor 200.

In various embodiments during step "b" first end 201 and item 1000 are electrically connected to a common ground 220. In various embodiments, the common ground is ROV 1000 itself. In various embodiments, the common ground is the frame of ROV 1000. In various embodiments, the common ground is a designated point 220.

In one embodiment of the method, during step "d" stream 2000 is sprayed on a subregion 1010 of item 1000.

Figure 6:
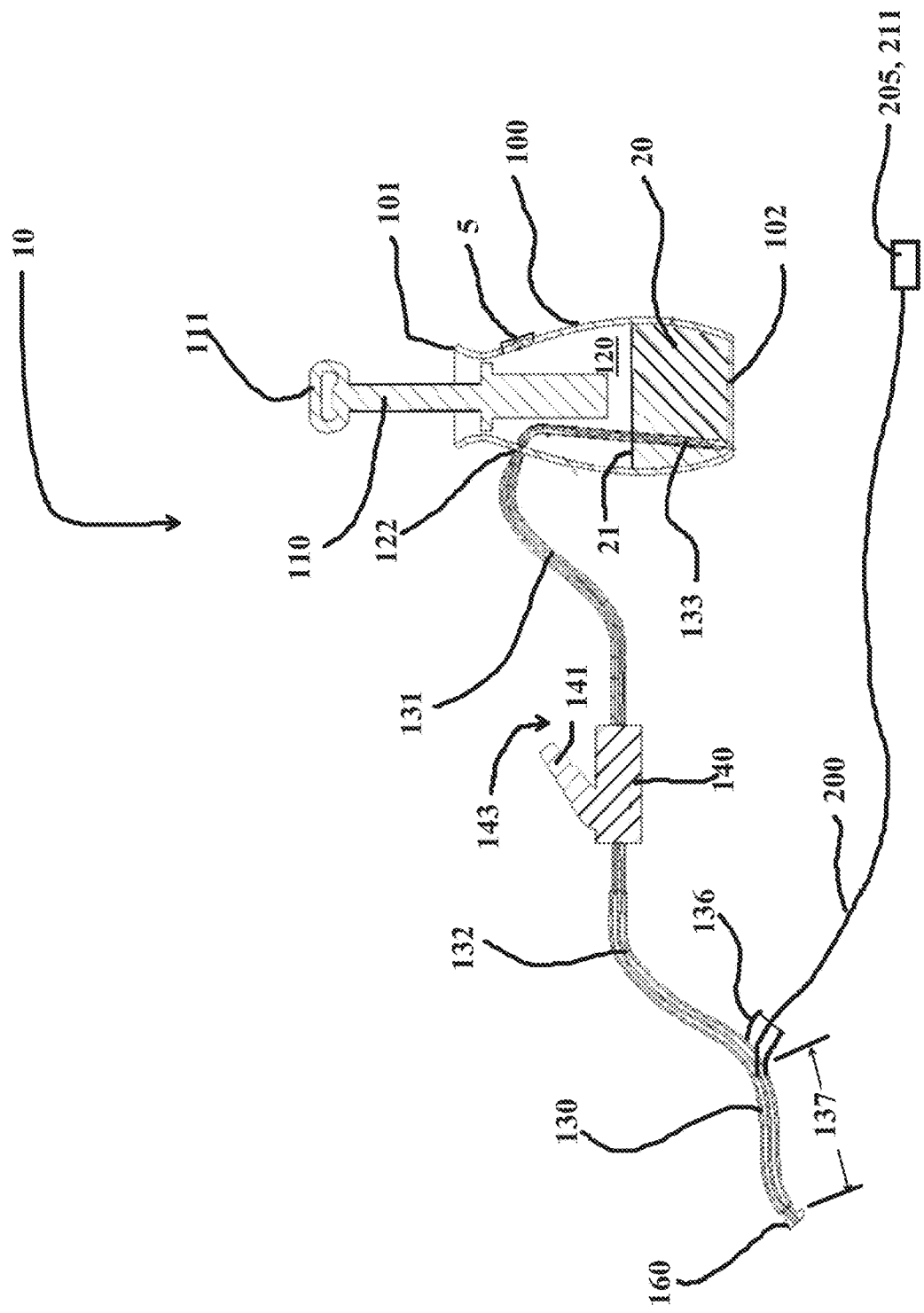
FIG. 6 is a sectional view of one embodiment of a detector where the conductor is at least partially located outside of the hose.

FIG. 6 is a sectional view of an alternative embodiment of a detector 10 where the conductor 200 is at least partially located outside of hose or pipe 130. In this alternative embodiment the method can be generally the same. It has the advantage that conductor 200 is not threaded through valve 140, but exits hose 132 a distance 137 from nozzle 160 via sealed coupling 136. It has the disadvantage that conductor 200 can become tangled as it is no longer controlled by hose or pipe 130. In various embodiments, conductor 200 can be clipped to the exterior of hose or pipe 130. In various embodiments, conductor 200 can be connected at nozzle 160. In various embodiments portions of conductor 200 can also be attached to the exterior of tank 100.

FIG. 8 is a perspective view schematically showing nozzle 160 with spray 2000 in the direction of arrow 3002 being used to test an insulated cable or wire 700 having an opening/worn area/crack or other imperfection that creates a short or fault regarding conducting portion 710. FIG. 9 is a side view of the testing step and FIG. 10 is a front view of the testing step. Detector 10 causes spray 2000 to come out of nozzle 160 in the direction of arrow 3002. As spray reaches opening/worn area/crack or other imperfection that creates a short or fault regarding conducting portion 710, current can flow through spray 2000 (schematically indicated by arrow 3002) to detect the short or fault.

FIGS. 11 through 13 show an alternative nozzle 600 which can be used with various embodiments to test one or more insulated cables or wires 700 which can comprise insulating 720 and conducting 710 portions. Nozzle 600 can include first end 602, second end 604, and shroud 630. First end 602 can have inlet 620 and port 622. Shroud 630 can have first side 632 and second side 634 with a gap 640. First 632 and second 634 sides can be arcuate and include a plurality of spaced apart openings 652 that are fluidly connected to port 622. Fluid moving through port 622 exits plurality of spaced apart openings 652 creating a plurality of fluid jets 650. Shroud 630 can be semicircular and extend at least 180 degrees to a complete circle, preferably at least 240 degrees, and more preferably at least 300 degrees. Alternative nozzle 600 is envisioned as being useful for testing one or more cylindrical cables 700 that where nozzle 600 can be moved along the one or more cylindrical cables 700 while a spray 2000 comprised of a plurality of jets 650 is created through spaced apart openings 652 for detecting an electrical fault or short in the one or more wires 700 such as caused by a pin hole 730 in the insulation coating of the one or more wires.

Figure 14:
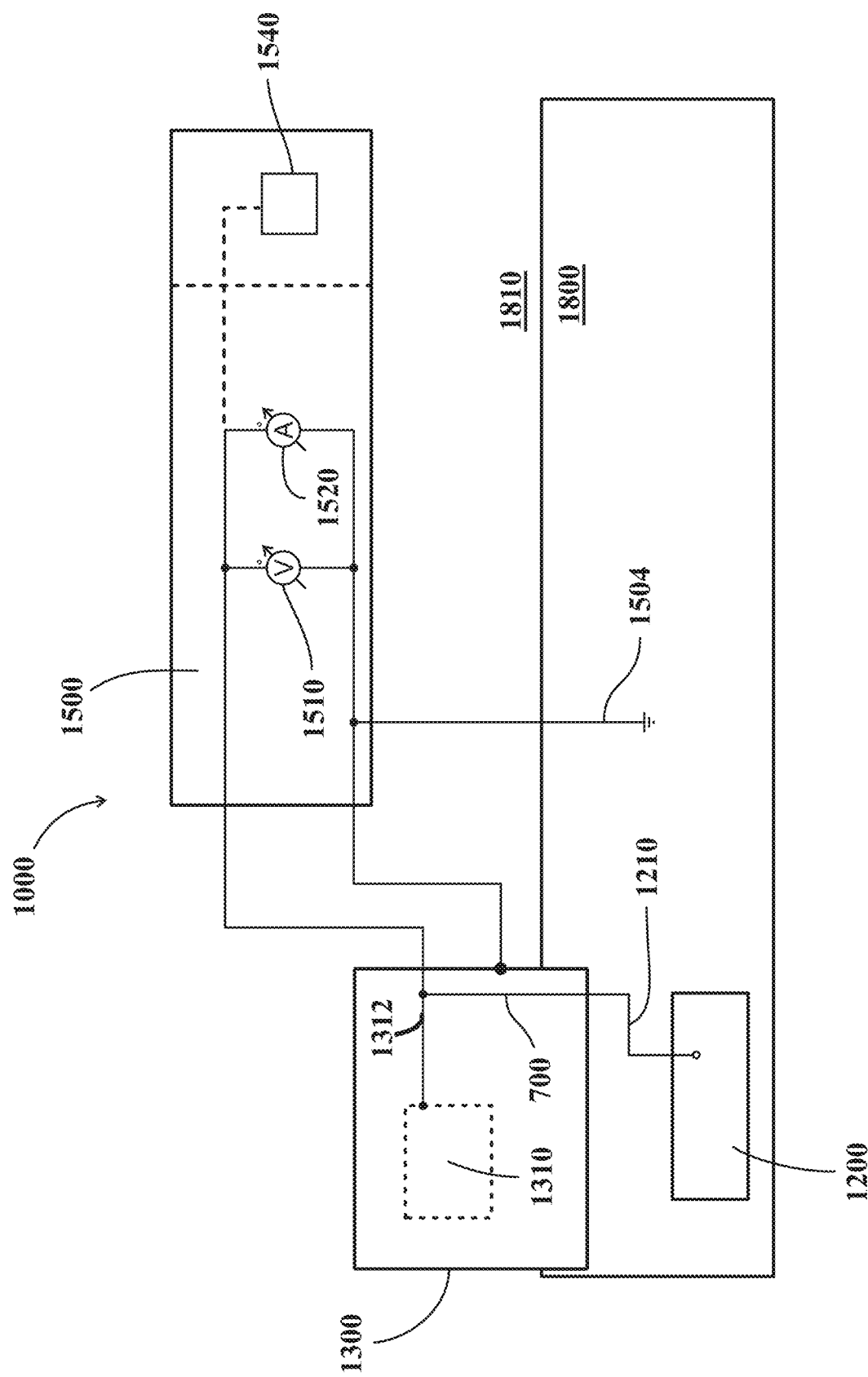
FIG. 14 schematically shows an item 1000 (e.g. ROV) to tested by the prior art method of submersion in body of water 1800.

FIG. 14 schematically shows an item 1000 (e.g. ROV) being tested by the prior art method of submersion in body of water 1800. In FIG. 14, item 1000 is shown in a non-short or non-fault condition and partially submerged in water. Item 1000 comprises housing 1300 with power source 1310 and external component 1200 which can include connected accessories such as a camera, lights manipulators, sensors, and sonar system. Electrical connection 1210 can connect external component and one or more of its accessories to item 1000 (e.g., line 700 can be used to connect external component 1200 to power source 1310). Item 1000 can also include a ground fault monitor/circuitry 1500 which circuitry can include a voltmeter 1510, amp meter 1520, and/or ohmmeter 1530 (not shown). Item 1000 can also include control and/or alarm circuitry 1540 which can include audio, visual, and actuators. Housing 1300 of item 1000 is partially located in air 1810 and partially submerged in water 1800 thereby making the submerged portion electrically connected to water 1800. Ground 1504 schematically indicates the GFI 1500 is also electrically connected to water 1800. Because there is no short or fault condition in item 1000 no short or fault condition is indicated by GFI 1500 when item 1000 is partially submerged in water 1800. It is noted that all wires are normally insulated.

Figure 15:
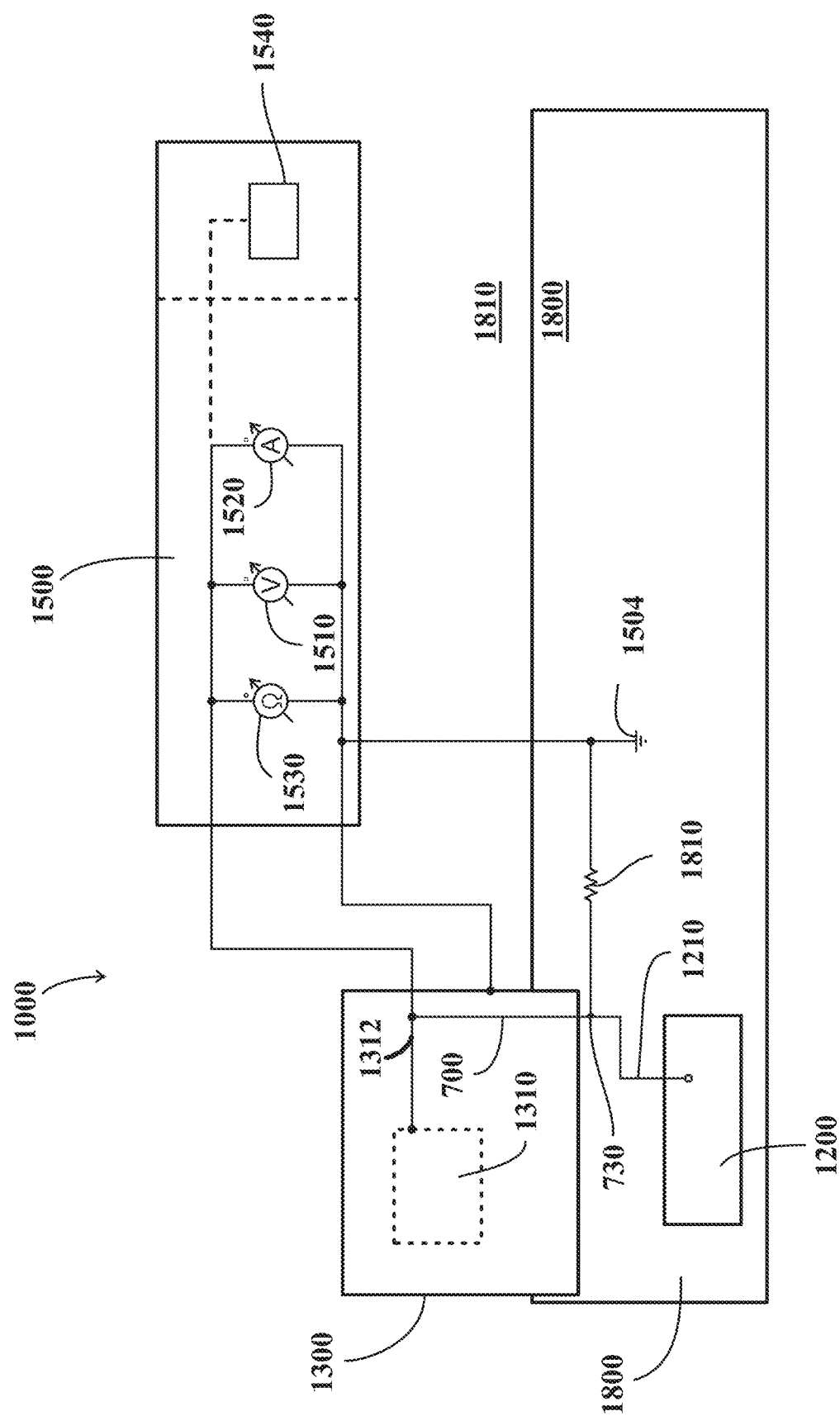
FIG. 15 schematically shows an item (e.g. ROV) to tested by the prior art method of submersion in body of water.

FIG. 15 schematically shows item 1000 (e.g. ROV) being tested by the prior art method of submersion in body of water 1800. In FIG. 15 item 1000 is shown in a short or fault condition with housing 1300 and accessories 1200 partially submerged in water 1800 (reference numeral 730 schematically indicates the short or fault condition being located in electrical connection 1200). Ground 1504 schematically indicates that at least housing 1300 of item 1000 is partially submerged and therefore electrically connected to water 1800. Because there is now a short or fault condition 730 in item 1000 (e.g., in cable or wire 1210 a short or fault connection 1810 is made between defective/shorted cable 1210 and ground 1504 which can be indicated by indicator 1540 of item 1000). The compromised condition 730 in the insulation creates or generates a conducting pathway through GFI system 1500 to ground 1504 and then to compromised area 730. However, this type of indication is a gross indication that a short or fault is somewhere in item 1000 and the user will have to spend time and iterations to identify exactly what the fault is. This is because water 1800 goes through the entire submerged portion of item 1000 and the prior art method does not allow localized detection of fault. In FIG. 15 water 1800 is substantially static and does not have a significant flow rate.

Figure 16:
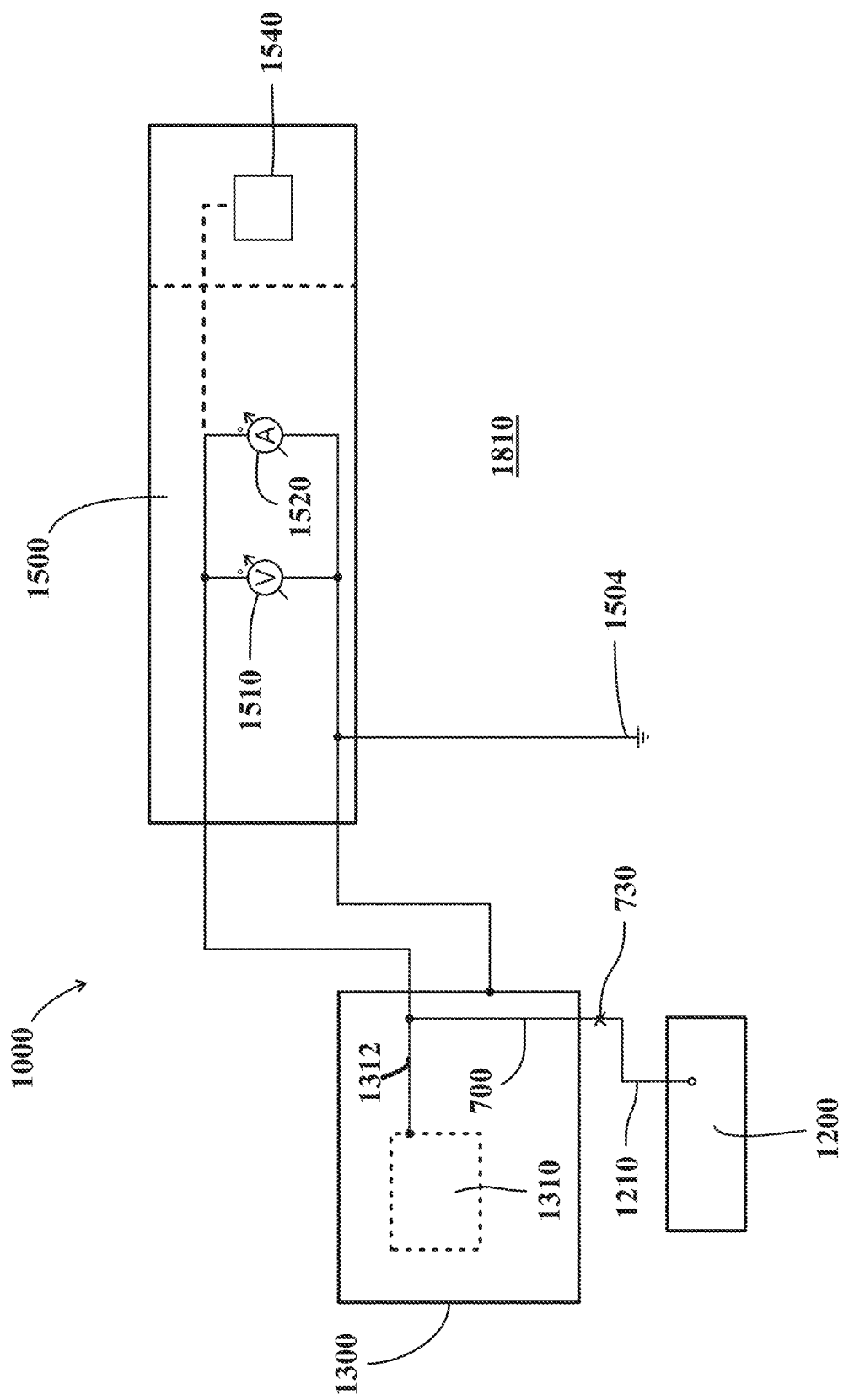
FIG. 16 schematically shows an item (e.g. ROV) having a short or fault in cable or wire.

FIG. 16 schematically shows an item 1000 (e.g. ROV) having a short or fault in cable or wire 1210. However, item 1000 is in air which is a relative insulator and the short or fault is not detected by GFI system 1500. The electronic system of item 1000 is not submerged in a conducting fluid (e.g., as shown in FIG. 15) so there is no ground fault indication in GFI system 1500 even though insulation in wire or cable 1210 is compromised (schematically indicated by reference numeral 730). That is the compromised condition 730 in the insulation does not create a conducting pathway through GFI system 1500 to ground 1504 (now in air 1810) and then to compromised area 730.

Figure 17:
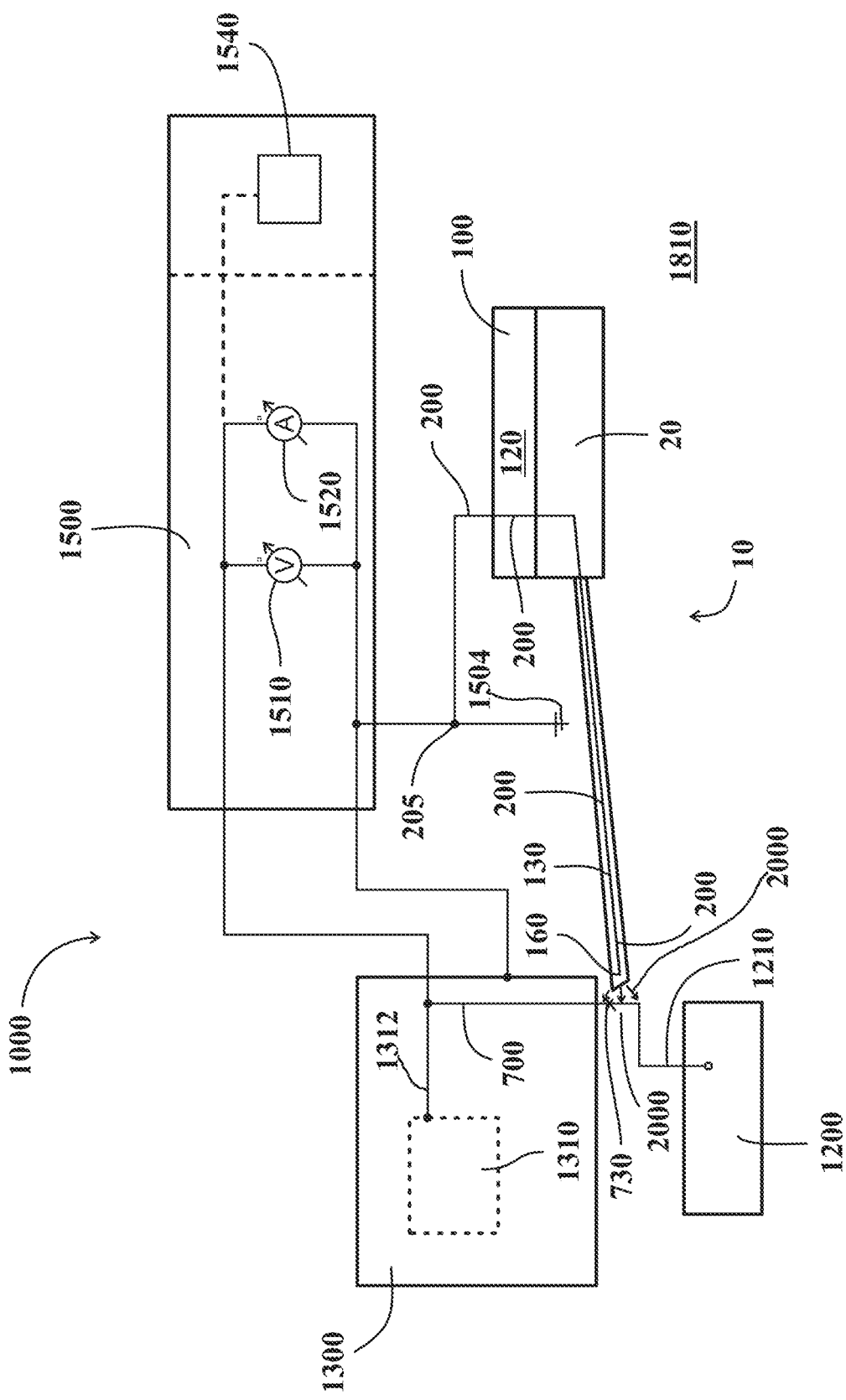
FIG. 17 shows detector being used to test item from FIG. 16 for a short or fault condition.
Figure 18:
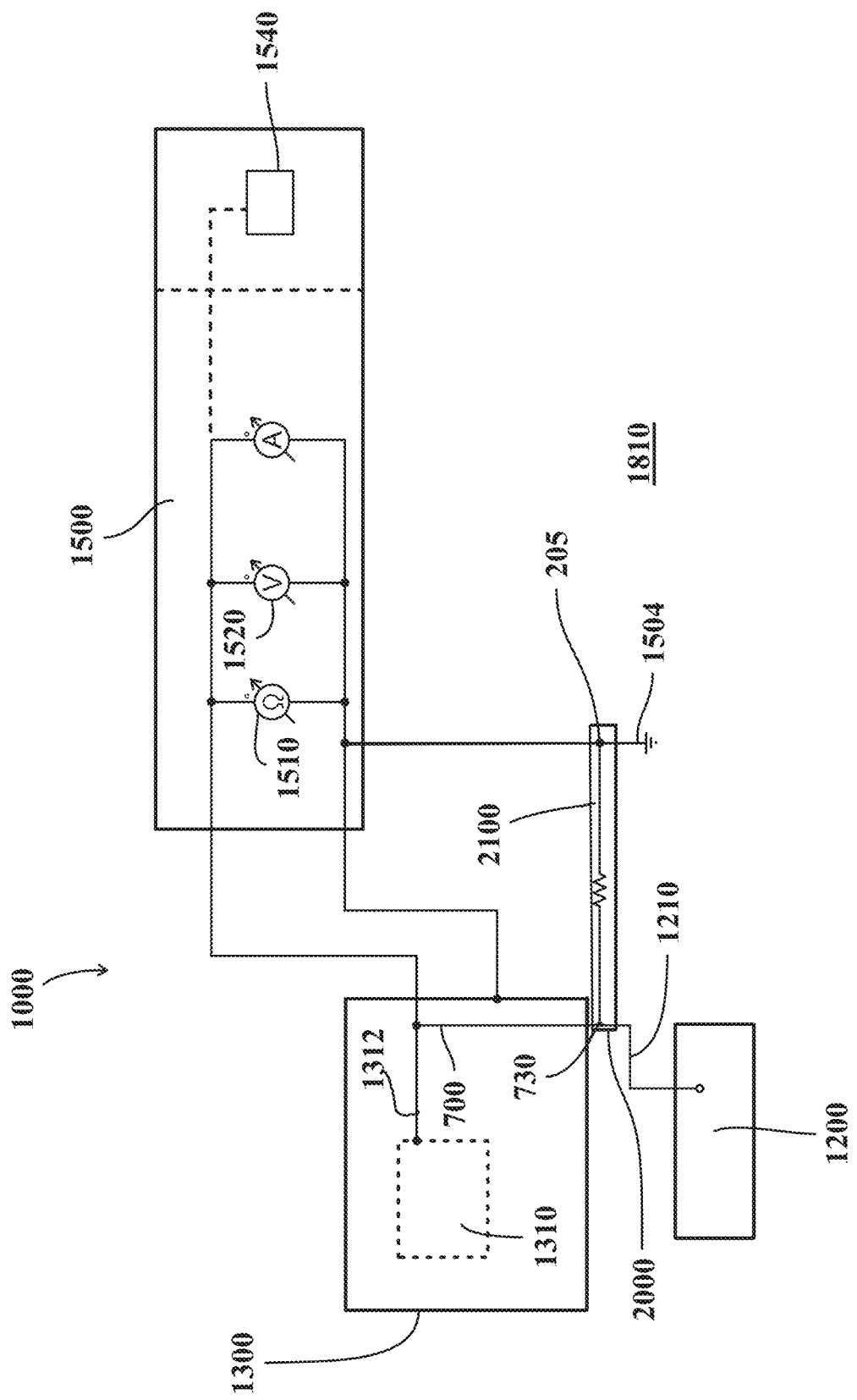
FIG. 18 schematically indicates the electrical connection by spray between localized short area, wire, clamp, and ground.

FIG. 17 shows detector 10 being used to test item 1000 from FIG. 16 for a short or fault condition. During this testing item 1000 is not submerged in a conducting fluid 1800 so without using the detector 10 there is no ground fault indication in GFI system 1500 even though insulation in wire or cable 1210 is compromised (schematically indicated by reference numeral 730). Similarly, other shorts or faults can be detected by detector 10 when power is shorted to housings, connectors, or other locations in items 1000 to be tested where the power (or data paths) can be shorted to the external environment. Detector 10 can be used to locate the short or fault 730 by generating a conducting path from the compromised insulation to the GFI monitor 1500. Detector 10 can be electrically connected to item 1000 via ground clamp 205 (e.g., via ground 1504). Detector 10 can include body 100 having an interior 120; hose, wand, or pipe 130 fluidly connected to interior 120; a trigger valve 140 operatively connect to hose 130; conductor 200 attached to detector 10; a pump 110 fluidly connected to interior 120. Fluid 20 can be contained in interior 120 of body 100. An operator 1 uses detector 10 to "localize test" item 1000 for shorts or fault conditions by causing spray 2000 of fluid 20 to exit wand 130 at nozzle 160 and contact item 1000 in a localized (e.g., not gross manner by submersion in water 1800 as done in the prior art). Localized testing should be distinguished from gross testing by considering gross a submergence of item 1000 in a body of fluid. As spray 2000 contacts localized opening/worn area/crack/imperfection 730 in cable 700 an electrical connection is made from fault area 730, through fluid spray 2000, to wire 200 (also in electrical contact with fluid 20 in spray 2000), and to ground 1504. FIG. 18 schematically indicates the electrical connection 2100 by spray 2000 between localized short area 730, wire 2000, clamp 205, and ground 1504. Such electrical connection 2100 will create a short or fault condition for item 1000 being tested and the short or fault condition can be sensed by voltmeter 1510 (e.g., drop or rise in voltage reading) and/or by amp meter 1520 (e.g., a current being read above a predefined set fault current). When spray 2000 is stopped the electrical connection between localized fault area 730, spray 2000, conductor 200, and ground 1504 is broken and the fault warning from GFI system 1500 will discontinue.

Figure 19:
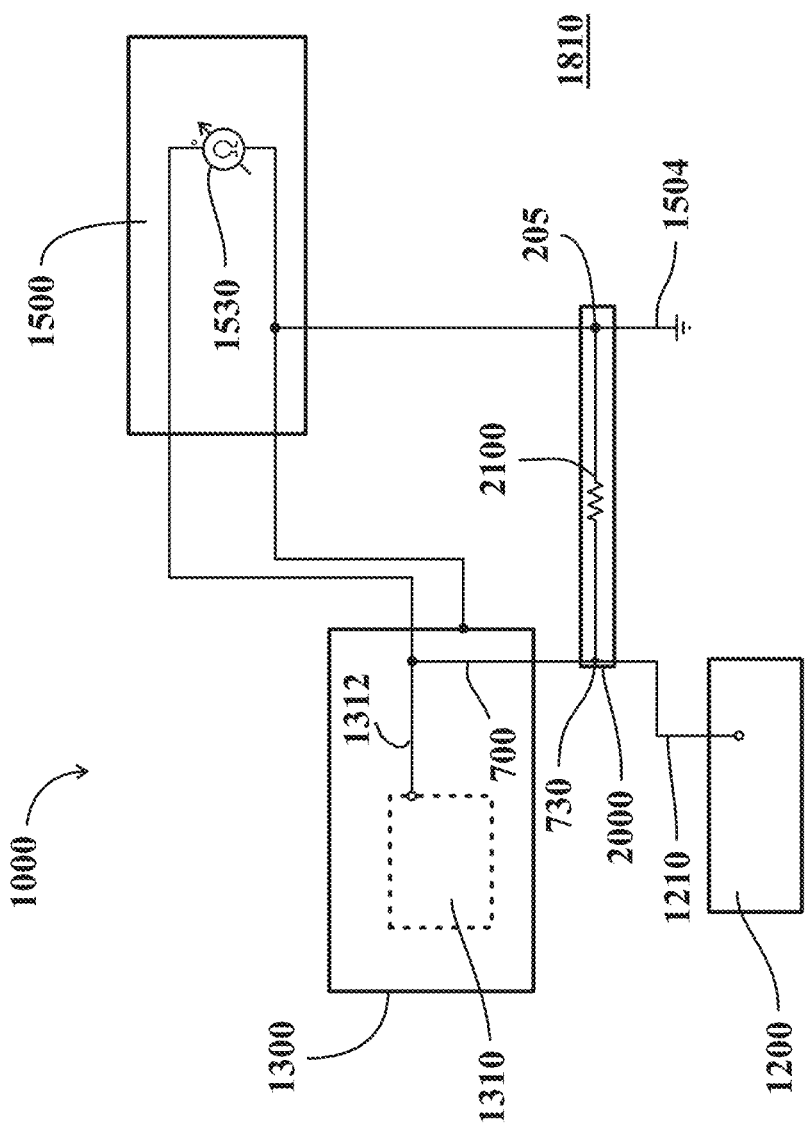
FIG. 19 schematically indicates the electrical connection by spray between localized short area, wire, clamp, and ground with ohm meter.

FIG. 19 schematically indicates the electrical connection 2100 by spray 2000 between localized short area 730, wire 2000, clamp 205, and ground 1504. Such electrical connection 2100 will create a short or fault condition for item 1000 being tested and the short or fault condition can be sensed by ohmmeter 1530 (e.g., drop in resistance through ohmmeter 1530. When spray 2000 is stopped the electrical connection between localized fault area 730, spray 2000, conductor 200, and ground 1504 is broken and the fault warning from GFI system 1500 will discontinue. This is because air 1810 is a relative non-conductive medium.

Figure 20:
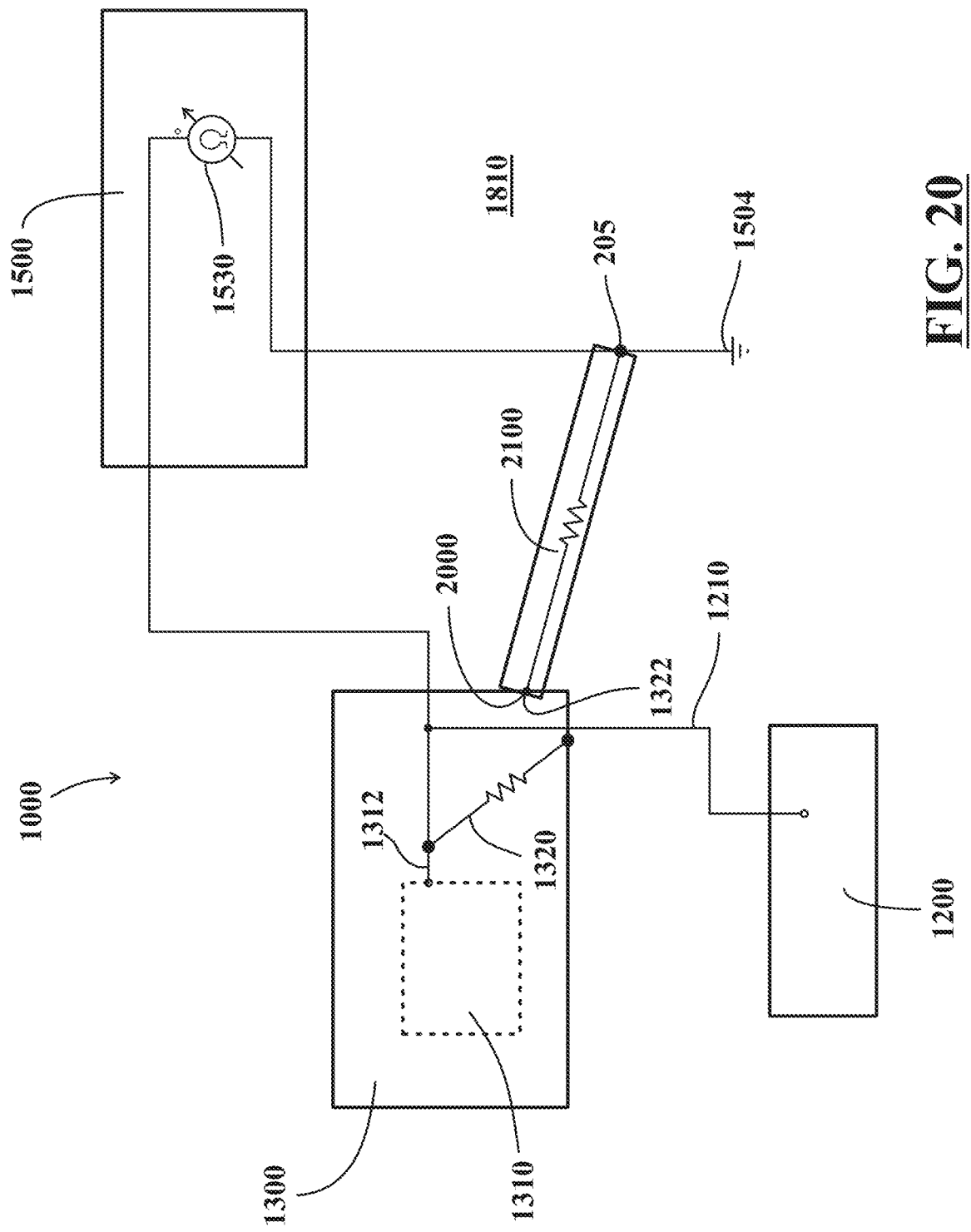
FIG. 20 schematically indicates the electrical connection by spray between localized short area on housing, wire, clamp, and ground with other sensors.

FIG. 20 schematically indicates the electrical connection by spray 2000 between localized short area 1322 on housing 1300, wire 2000, clamp 205, and ground 1504. Localized short area 1320 in this case is electrically connected to housing 1300. Such electrical connection 2100 spray 2000 will create a short or fault condition for item 1000 being tested and the short or fault condition can be sensed by ohmmeter 1530 (e.g., drop in resistance through ohmmeter 1530). In this case electrical connection 2100 created by spray 2000 provides an effective ground path. When spray 2000 is discontinued the electrical connection between localized short area 1322, spray 2000, conductor 200, and ground 1504 is broken and the fault warning from GFI system 1500 will discontinue (this is because air 1810 is a relative non-conductive medium). Now in FIG. 20 localized area 1322 is shown schematically, however, because housing 1300 can be a single electrical unit, any short or fault electrically connected to housing 1300 will electrically connected to ground 1504 by spray 2000 contacting housing 1300 at any location of housing 1300. In this manner additional investigation will need to be performed using detector 10 to further isolate the location of the localized short or fault condition in item 1000 to be tested.

Figure 21:
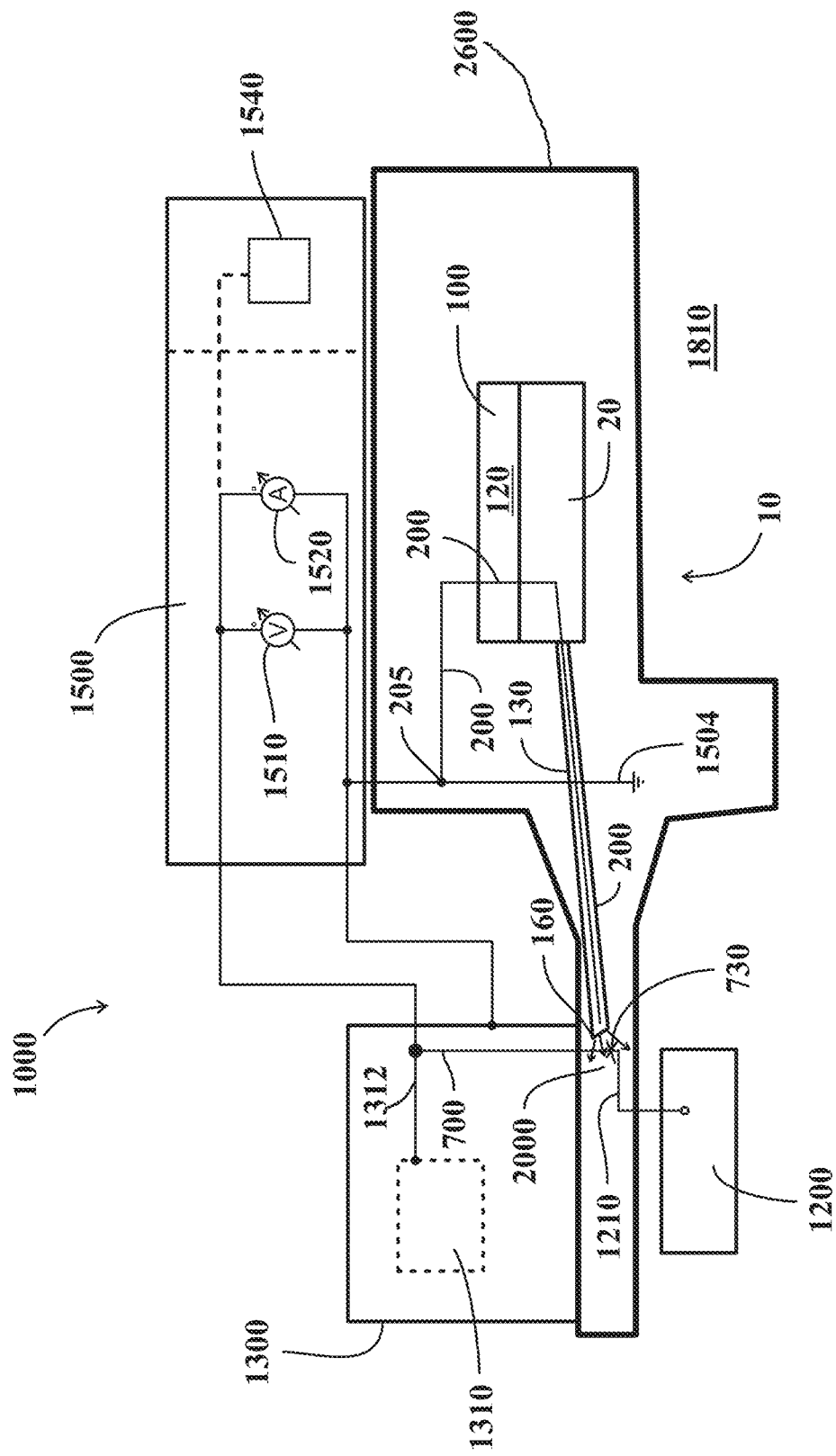
FIG. 21 schematically shows an alternative embodiment for detector that does not include a meter or readout.
Figure 22:
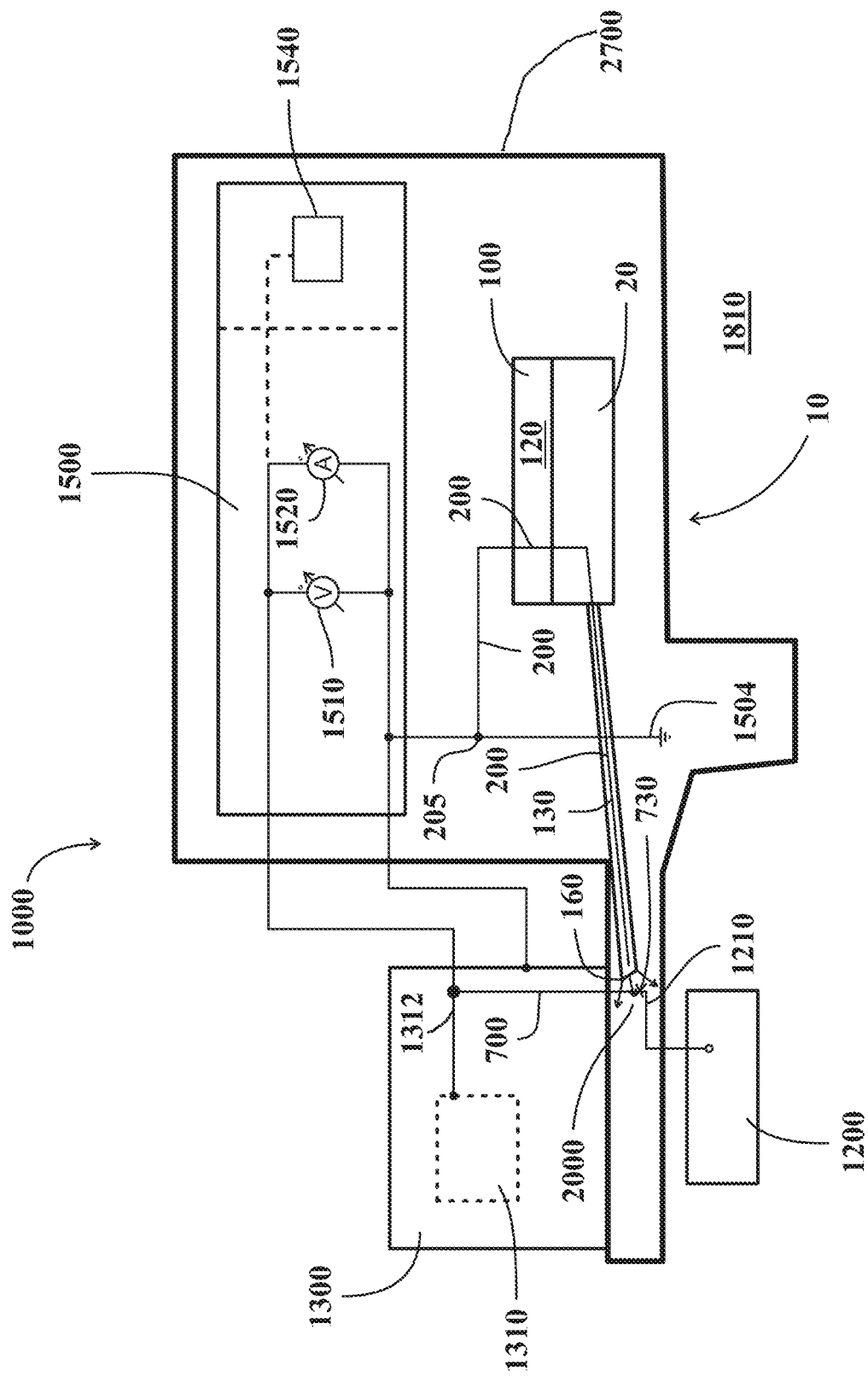
FIG. 22 schematically shows an alternative embodiment for detector does include a meter or readout.
Figure 26:
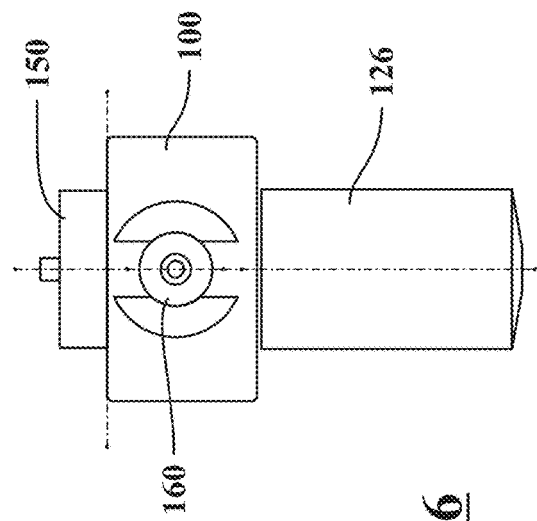
FIG. 26 is a side view of the detector of FIG. 24 rotated ninety degrees.

FIGS. 21 and 22 illustrate alternative embodiments for detector 10. In FIG. 21 a base model of detector 10 is shown in the bolded box 2600 being used to detect localized short or fault area 730. In this embodiment GFI system 1500 is connected to item 1000 to be tested and can be incorporated into item 1000 to be tested. In FIG. 22 GFI system can be part of detector 10 and then electrically connected to item 1000 to be tested (detector 10 is schematically indicated by the components contained in bolded box 2700).

Figure 23:
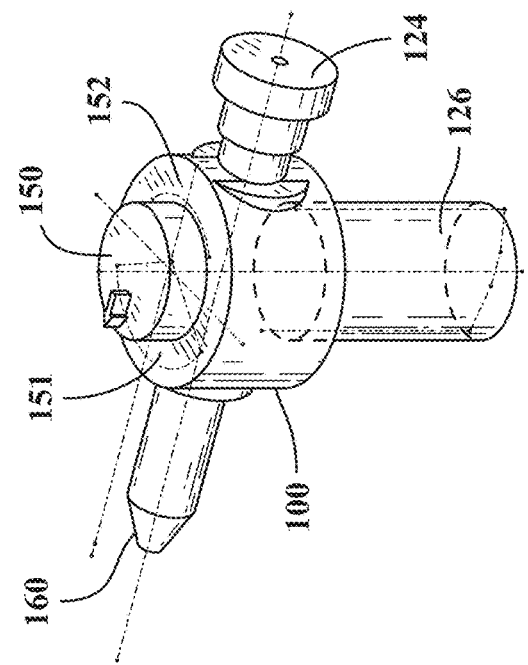
FIG. 23 is a perspective view of an alternative embodiment of detector.
Figure 24:
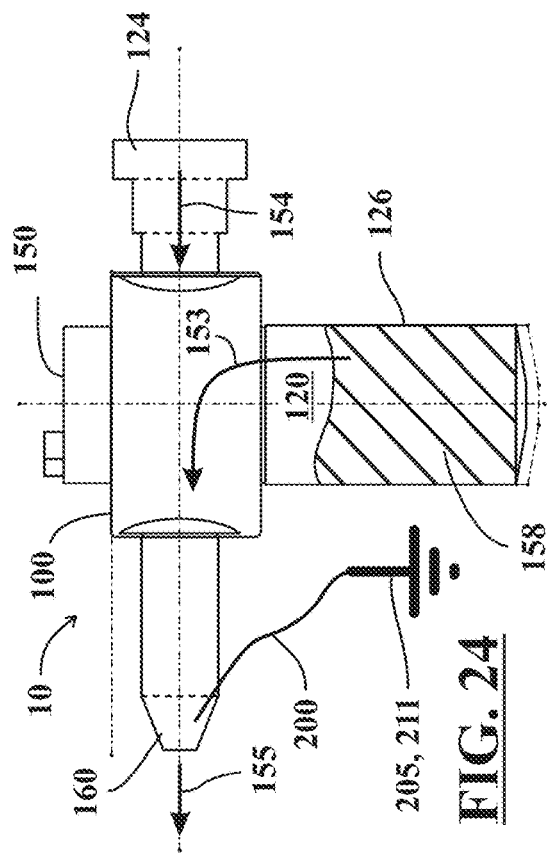
FIG. 24 is a side view of the detector of FIG. 23.
Figure 25:
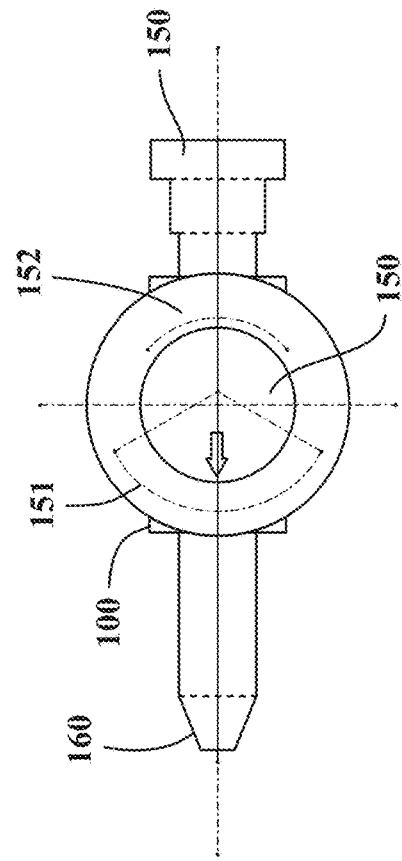
FIG. 25 is a top view of the detector of FIG. 23.

FIGS. 23 through 25 show an alternative embodiment of detector 10. In this embodiment detector 10 can include the following components:

(a) a body 100;
(b) an outlet 160 fluidly connected to body 100;
(c) an inlet 124 fluidly connected to body 100
(d) a reservoir 126 fluidly connected to body 100 and containing electrically conductive materials 158;
(e) a conductor 200 electrically connected to outlet 160; and/or
(f) a selector 150 fluidly controlling the mixing of fluid exiting outlet 160 between fluid entering inlet 124 and electrically conductive materials 158 contained in reservoir 126.

In this embodiment selector 150 can have selector positions of: (a) mixing 151 wherein fluid entering inlet 124 mixes with electrically conductive materials 158 contained in reservoir 126 and (b) non-mixing 152 wherein fluid entering inlet 124 does not mix with electrically conductive materials contained in reservoir 126.

Electrically conductive materials 158 can be materials that increase the conductivity of fluid entering inlet 124 and can be solid, granular, and/or liquid. For example granular salt could be used to increase the conductivity of fresh water entering outlet 124 with the fluid and conductive materials exiting outlet 160 being sufficiently conduct to create a complete circuit when sprayed over an area of a short or fault.

When selector 150 is set in position 151 fluid entering entrance 124 (schematically indicated by arrow 154) can mix with electrically conductive material 20 in reservoir 126 (schematically indicated by arrow 153) and exit outlet 160. When selector 150 is set in position 152 fluid entering entrance 124 (schematically indicated by arrow 154) will not mix with electrically conductive material 158 in reservoir 126 but bypass material 158 and exit outlet 160.

The following is a parts list of reference numerals or part numbers and corresponding descriptions as used herein:

TABLE OF REFERENCE NUMERALS

| Reference Numeral | Description |
|---|---|
| 1 | user |
| 5 | display |
| 10 | detector |
| 20 | electrically conductive fluid |
| 21 | top |
| 22 | bottom |
| 100 | body |
| 101 | first end of body |
| 102 | second end of body |
| 104 | top opening |
| 110 | pump |
| 111 | first end of pump |
| 112 | second end of pump |
| 120 | interior |
| 121 | inlet |
| 122 | outlet |
| 123 | air tight fluid reservoir pump inlet |
| 124 | pressurized fluid connector |
| 130 | hose or wand |
| 131 | first section of hose or wand 130 |
| 132 | second section of hose or wand 130 |
| 133 | third section |
| 135 | opening |
| 136 | sealed outlet |
| 137 | distance |
| 140 | trigger valve |
| 141 | trigger |
| 143 | arrow for opening trigger valve |
| 150 | selector valve |
| 151 | mixing position |
| 152 | non-mixing or rinsing position |
| 153 | arrow |
| 154 | arrow |
| 155 | arrow |
| 158 | electrically conductive materials |
| 160 | nozzle |
| 162 | tip |
| 170 | average distance from nozzle to surface of item being investigated |
| 174 | area of spray |
| 200 | conductor |
| 201 | first end |
| 202 | second end |
| 205 | ground clamp |
| 210 | conduit |
| 211 | first section of conduit |
| 212 | second section of conduit |
| 220 | ground connection |
| 300 | conductor |
| 305 | ground clamp |
| 310 | wire conduit |
| 311 | non-insulated portion of wire conduit |
| 312 | insulated portion of wire conduit |
| 320 | tip of wire conduit |
| 400 | conductor |
| 405 | ground clamp |
| 410 | wire conduit |
| 411 | non-insulated portion of wire conduit |
| 412 | insulated portion of wire conduit |
| 420 | tip of wire conduit |
| 430 | outlet for wire conduit |
| 450 | outlet for wire conduit |
| 600 | alternative nozzle with shroud |
| 610 | base |
| 620 | inlet |
| 622 | port |
| 630 | shroud |
| 632 | first side |
| 634 | second side |
| 640 | spacing between ends of shroud |
| 650 | plurality of jets |
| 652 | plurality of openings |
| 660 | annular gap |
| 700 | insulated wire |
| 710 | conducting portion |
| 720 | insulation |
| 730 | opening/worn area/crack/imperfection in insulation |
| 1000 | item believed to have electrical short or fault or ROV |
| 1002 | display |
| 1004 | ground |
| 1005 | sonar |
| 1006 | light |
| 1007 | light connector |
| 1008 | light cable |
| 1009 | display |
| 1010 | region believed to have electrical short of fault |
| 1015 | region believed to have electrical short of fault |
| 1020 | region believed to have electrical short of fault |
| 1025 | region believed to have electrical short of fault |
| 1030 | region believed to have electrical short of fault |
| 1035 | region believed to have electrical short of fault |
| 1040 | region believed to have electrical short of fault |
| 1045 | region believed to have electrical short of fault |
| 1050 | region believed to have electrical short of fault |
| 1061 | face or side |
| 1062 | face or side |
| 1063 | face or side |
| 1064 | face or side |
| 1065 | face or side |
| 1066 | face or side |
| 1101 | voltage |
| 1200 | external components) (accessories e.g., camera, lights, manipulators, sonars, sensors) |
| 1210 | electrical connection for accessories |
| 1300 | housing or frame |
| 1304 | tether |
| 1310 | power source |
| 1312 | voltage + |
| 1320 | short |
| 1500 | GFI |
| 1504 | ground for GFI |
| 1510 | voltmeter |
| 1520 | amp meter |
| 1530 | ohmmeter |
| 1540 | indicators or controls (audio, visual, actuators) |
| 1800 | water |
| 1810 | water short |
| 2000 | fluid stream |
| 2001 | direction of stream |
| 2100 | spray electrical connection |
| 2500 | direction of electricity flowing through closed circuit created by stream |
| 2600 | box |
| 2700 | box |
| 3000 | pressure applied by pump |
| 3002 | arrow |
| 3004 | arrow |
| 4000 | current |
| 5000 | short signal |
| 5010 | short |

All measurements disclosed herein are at standard temperature and pressure, at sea level on Earth, unless indicated otherwise. All materials used or intended to be used in a human being are biocompatible, unless indicated otherwise.

While certain novel features of this invention shown and described herein are pointed out in the annexed claims, the invention is not intended to be limited to the details specified, since a person of ordinary skill in the relevant art will understand that various omissions, modifications, substitutions and changes in the forms and details of the device illustrated and in its operation may be made without departing in any way from the spirit of the present invention. No feature of the invention is critical or essential unless it is expressly stated as being "critical" or "essential."

It will be understood that each of the elements described above, or two or more together may also find a useful application in other types of methods differing from the type described above. Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention set forth in the appended claims. The foregoing embodiments are presented by way of example only; the scope of the present invention is to be limited only by the following claims.

The invention claimed is:

1. A method of detecting an electrical leak, comprising:
   (a) providing a voltage on item which is believed to have an electrical short or fault;
   (b) providing a electrical short or fault detector, the detector comprises:
      (i) a body, the body having an interior and an outlet fluidly connected to the interior
      (ii) a volume of electrically conductive liquid contained in the interior, and
      (iii) a conductor electrically connected to the liquid contained in the interior;
   (c) electrically connecting the conductor to the item believed to have an electrical short or fault;
   (d) causing a stream of electrically conductive liquid from the outlet to the item believed to have an electrical short or fault; and
   (e) during step "d", measuring a fault or short based on the item believed to have an electrical short or fault where an electrical current runs through the stream of electrically conductive liquid to close a short circuit.

2. The method of claim 1, wherein the volume of electrically conductive liquid has a top level and the interior of the body includes a pipe section with a pipe section interior, the pipe section having an opening located below the top level and adjacent second end, and the conductor also passes through the pipe section interior.

3. The method of claim 1, wherein during step "d" a closed circuit is formed between the item and the stream of electrically conductive liquid.

4. A method of detecting a leak, comprising the steps of:
   (a) providing an item 1000 to be checked for an electrical short or fault;
   (b) providing an electrical short or fault detector 10, the detector comprising a body 100 having an interior 120 and an outlet 160 fluidly connected to the interior 120, and a volume of electrically conductive fluid 20 contained in the interior 120;
   (c) causing a stream 2000 of electrically conductive liquid to run in a first direction 3002 from the outlet 160 to a localized area 1010 of the item 1000; and
   (d) during step "c" the stream 2000 causing a current 4000 to run through the stream 2000 of electrically conductive liquid and further causing a fault or short signal 5000 to occur.

5. The method of claim 4, wherein during step "c" a closed circuit is formed between the item 1000 and the stream 2000 of electrically conductive liquid.

6. The method of claim 4, wherein in step "b" the detector 10 has a valve 140 fluidly connecting the nozzle 160 to the interior 120 of the detector 10, and in step "c" includes opening the valve 140 which starts the stream 2000 flowing.

7. The method of claim 4, wherein during step "b", the body 100 includes an outlet and a hose connected to the outlets, and a nozzle connected to the hose.

8. The method of claim 4, wherein during step "b", the body 100 includes an outlet and a hose connected to the outlets, and a nozzle connected to the hose, wherein the hose includes a hose interior and the conductor 200 passes through the hose interior.

9. The method of claim 4, wherein the volume of electrically conductive 20 has a top level 21 and the interior 120 of the body 100 includes a pipe section 133 with a pipe section interior, the pipe section 130 having an opening located below the top level 21 and adjacent second end 102 of the body 100, and the conductor 200 also passes through the pipe section interior.

10. The method of claim 4, wherein during step "c" and before step "d", the stream 2000 is directed to a first subregion 1010 of item 1000, then to a second subregion 1015 of item 1000, and then to a third subregion 1020 of item 1000.

11. The method of claim 4, wherein during step "c", between moving stream 2000 from first subregion 1010 to second subregion 1020, valve 140 is shut off stopping stream 2000 and then reopened restarting stream 2000, between moving stream 2000 from second subregion 1020 to third subregion 1030, valve 140 is shut off stopping stream 2000 and then reopened restarting stream 2000, and between moving stream 2000 from third subregion 1030 to fourth subregion 1040, valve 140 is shut off stopping stream 2000 and then reopened restarting stream 2000.

12. The method of claim 4, wherein during step "d", a warning signal is received that a short or fault is detected in item 1000, herein the warning is a visual and/or audible signal.

13. The method of claim 12, wherein the warning signal is created be based on a set of predefined warning criteria being met for detector 10.

14. The method of claim 13, wherein the electrical short or fault detector 10 includes a conductor 200, and the predefined warning criteria is a current being measured passing through conductor 200 greater than a predefined minimum current.

15. The method of claim 13, wherein the predefined warning criteria is a voltage drop measured greater than a predefined minimum voltage drop.

16. The method of claim 4, wherein in step "d", a closed circuit is created between detector 10 and item 1000.

17. A method of detecting an electrical short or fault in a subregion a ROV/item 1000 believed to have an electrical short or fault 1010, comprising the steps of:
   (a) accessing an item 1000 to be checked for an electrical short or fault, the item 1000 having an exterior surface 1100 with a total exterior surface area 1110, and plurality of sub-regions 1200 each having an exterior subregion surface area which is substantially smaller than the total exterior surface area 1110;
   (b) providing an electrical short or fault detector 10, the detector having a body 100 with an interior 120 and an outlet 160 fluidly connected to the interior 120, a volume of electrically conductive fluid 20 contained in the interior 120, and a conductor 200 having first 201 and second 202 ends and electrically connecting the first end 201 to the item 1000;
   (c) causing a stream 2000 of electrically conductive liquid to be sprayed on the item 1000 from the outlet 160 to a localized area 1020 of the item 1000; and
   (d) during step "c" the stream 2000 creating a closed circuit between the stream 1000, the item 1000, and the conductor 200.

18. The method of claim 17, wherein during step "b", the first end 201 and the item 1000 are electrically connected to a common ground 220.

19. The method of claim 18, wherein the common ground is the ROV 1000 itself.

20. The method of claim 17, wherein during step "d" stream 2000 is sprayed on a subregion 1020 of item 1000.

* * * * *